(12) United States Patent
Ono et al.

(10) Patent No.: US 7,199,398 B2
(45) Date of Patent: Apr. 3, 2007

(54) NITRIDE SEMICONDUCTOR LIGHT EMITTING DEVICE HAVING ELECTRODE ELECTRICALLY SEPARATED INTO AT LEAST TWO REGIONS

(75) Inventors: Tomoki Ono, Pittsburgh, PA (US); Shigetoshi Ito, Ikoma (JP); Toshiyuki Okumura, Tenri (JP); Hirokazu Mouri, Ikoma (JP); Kyoko Matsuda, Daianji (JP); Toshiyuki Kawakami, Nara (JP); Takeshi Kamikawa, Mihara (JP); Yoshihiko Tani, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/719,739

(22) Filed: Nov. 20, 2003

(65) Prior Publication Data

US 2004/0099870 A1 May 27, 2004

(30) Foreign Application Priority Data

Nov. 20, 2002 (JP) .............................. 2002-336660

(51) Int. Cl.
*H01L 29/10* (2006.01)
*H01L 29/22* (2006.01)
*H01L 21/00* (2006.01)
*H01S 3/097* (2006.01)

(52) U.S. Cl. .................... 257/66; 257/94; 257/101; 257/79; 438/22; 438/47; 372/4.01; 372/87

(58) Field of Classification Search ................ 257/86, 257/94, 101, 79, 66; 372/44.01, 87, 43.01, 372/45.013, 46.01, 49.01; 313/498, 499; 438/22, 47

See application file for complete search history.

(56) References Cited

U.S. PATENT DOCUMENTS

| | | | | |
|---|---|---|---|---|
| 4,146,883 A | * | 3/1979 | Appeldorn et al. | 340/815.44 |
| 4,241,319 A | * | 12/1980 | Papayoanou | 372/68 |
| 5,425,043 A | * | 6/1995 | Holonyak et al. | 372/50 |
| 5,459,747 A | * | 10/1995 | Takiguchi et al. | 372/50.11 |
| 5,523,256 A | * | 6/1996 | Adachi et al. | 438/31 |
| 5,663,975 A | * | 9/1997 | Yoshida et al. | 372/46 |
| 5,966,397 A | * | 10/1999 | Hirata | 372/46 |
| 5,974,068 A | * | 10/1999 | Adachi et al. | 372/46 |
| 5,978,397 A | * | 11/1999 | Capasso et al. | 372/45 |
| 6,121,634 A | * | 9/2000 | Saito et al. | 257/86 |
| 6,185,238 B1 | * | 2/2001 | Onomura et al. | 372/46.01 |
| 6,242,761 B1 | * | 6/2001 | Fujimoto et al. | 257/94 |
| 6,463,088 B1 | * | 10/2002 | Baillargeon et al. | 372/46 |
| 6,515,308 B1 | * | 2/2003 | Kneissl et al. | 257/86 |
| 6,617,607 B2 | * | 9/2003 | Ito et al. | 257/22 |
| 6,931,042 B2 | * | 8/2005 | Choquette et al. | 372/43.01 |
| 7,058,104 B2 | * | 6/2006 | Ueki et al. | 372/44.01 |
| 2001/0035532 A1 | * | 11/2001 | Ito et al. | 257/103 |
| 2002/0149828 A1 | * | 10/2002 | Miles et al. | 359/260 |
| 2004/0026685 A1 | * | 2/2004 | Ito et al. | 257/22 |

FOREIGN PATENT DOCUMENTS

| | | |
|---|---|---|
| JP | 01-251775 | 10/1989 |
| JP | 09-191160 | 7/1997 |

* cited by examiner

*Primary Examiner*—Long Pham
*Assistant Examiner*—Shrinivas H. Rao
(74) *Attorney, Agent, or Firm*—Morrison & Foerster LLP

(57) ABSTRACT

A nitride semiconductor light emitting device includes at least a substrate, an active layer formed of a nitride semiconductor containing mainly In and Ga, a p-electrode and an n-electrode. At least one of the p-electrode and n-electrode is electrically separated into at least two regions.

18 Claims, 15 Drawing Sheets

40 μs

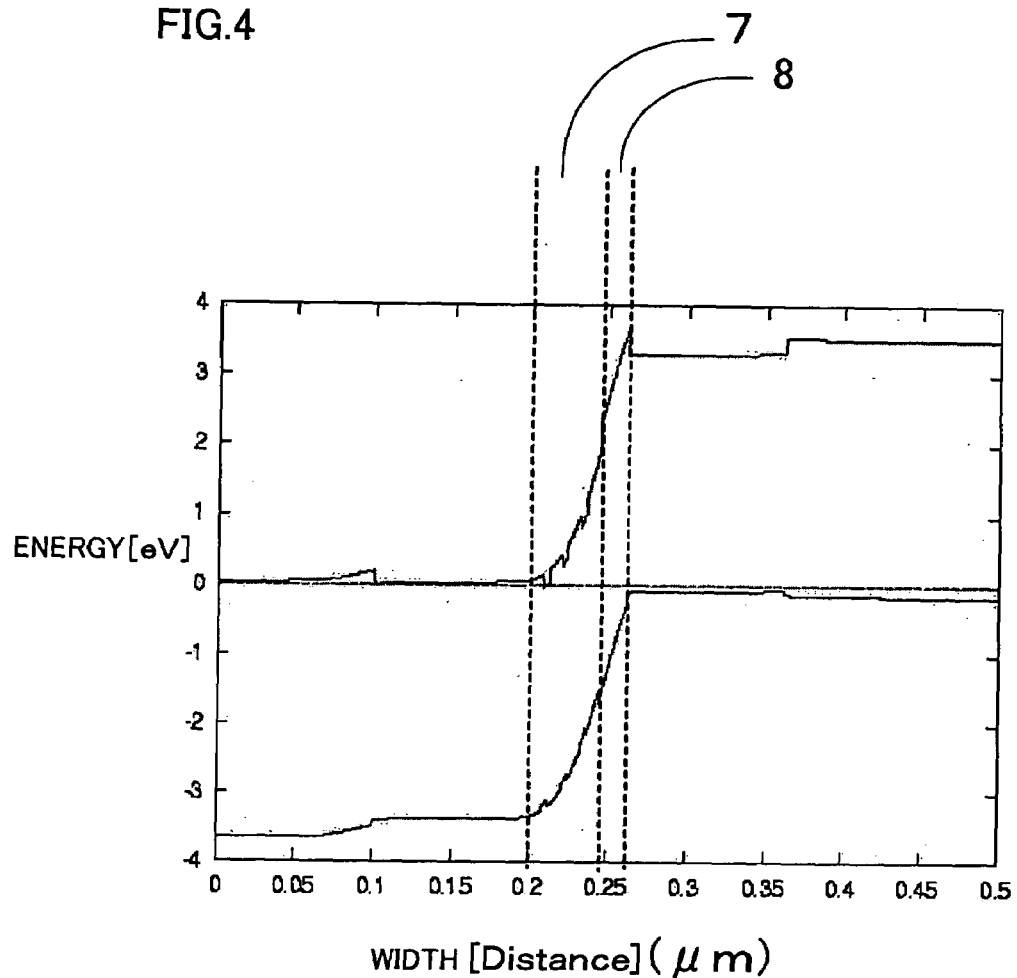

NITRIDE SEMICONDUCTOR LIGHT EMITTING DEVICE HAVING ELECTRODE ELECTRICALLY SEPARATED INTO AT LEAST TWO REGIONS

BACKGROUND OF THE INVENTION

1. Field of the Invention

The present invention relates to nitride semiconductor light emitting devices. More particularly, the present invention relates to a multielectrode type nitride semiconductor light emitting device having at least one of a p-electrode and an n-electrode electrically separated into at least two regions.

2. Description of the Background Art

A nitride semiconductor laser which is one example of a nitride semiconductor light emitting device has attracted much research efforts to be employed as a light source for an optical disk system in view of the emission wavelength being approximately 400 nm. On occasions where such a nitride semiconductor laser is employed as the light source of an optical disk system and the like, the problem of the reflected light from the disk surface recombining with the semiconductor laser to cause optical feedback noise is of concern. It is generally known that the coherence can be reduced by setting the carrier density of the semiconductor laser in a transition state to alleviate gain convergence of the oscillation spectrum. It is considered preferable to conduct self pulsation through high frequency superposition modulating injection current, and the interaction between carriers and photons in the semiconductor laser. Particularly, the usage of the latter self pulsation device is advantageous from the standpoint of cost and usability since a high frequency circuit is dispensable.

Japanese Patent Laying-Open No. 9-191160 discloses a low noise semiconductor laser for an optical disk as a nitride semiconductor laser having self pulsation characteristics. A low noise semiconductor laser that is stable by virtue of including a saturable absorption layer with InGaN as the constituent element is provided, as shown in FIG. 14. This low noise semiconductor laser has a structure set forth below. On an n type SiC substrate 400, an n type AlN layer 401, an n type AlGaN clad layer 402, an n type GaN light guide layer 403, an InGaN quantum well active layer 404, a p type GaN light guide layer 405, a p type AlGaN clad layer 406 and a p type GaN contact layer 407 are sequentially formed. An InGaN saturable absorption layer 408 is provided at p type GaN light guide layer 405.

The aforementioned active layer and saturable absorption layer containing In exhibit poor stability in characteristics due to strain by the substrate and variation in the growing conditions. It is to be particularly noted that variation in the characteristics of the saturable absorption layer may degrade the yield of self pulsation. The growth temperature of the saturable absorption layer is reduced to approximately 850° C. at most due to the inclusion of In. This is lower by at least 100° C. than the growth temperature of an adjacent nitride layer containing Ga as the main element or the nitride layer containing Al and Ga as the main elements. The difference in the growth temperature may sometimes become more than 300° C. Thus, there is a possibility that the processing step during deposition will be rendered complicated by the provision of such a saturable absorption layer. Also, the thermal hysteresis during deposition may adversely affect the characteristics of the active layer. It is to be also noted that the light passing through the waveguide will always be susceptible to the saturable absorption layer occupying one entire layer in the multilayer structure.

Japanese Patent Laying-Open No. 1-251775 discloses a multielectrode type semiconductor light emitting device as another semiconductor laser. The active layer of this semiconductor light emitting device is of AlGaAs base, and does not contain N (nitrogen). In this publication, the position relationship between the p-n junction and active layer in a non-bias state and the impurity concentration of the peripheral layer for the semiconductor light emitting device are not clarified. It cannot be said that a general structure is presented. Specifically, possible effects of a saturable absorber in a non-bias state, when the active layer is not spatially overlapped with the depletion layer generated in the p-n junction, include absorption due to current not being injected, and a carrier recombination effect in the active layer. Another possible effect may be promotion of carrier discharge from the active layer by the internal electric field of the depletion layer after some of the carriers are diffused as far as the depletion layer due to the feasible diffusion of carriers of the GaAs-base active layer. It is considered that, for the purpose of obtaining favorable self pulsation, the aforementioned structure is subject to limitation imposed by the material or the structure such as the high differential gain of the active layer, feasible diffusion of carriers, and the like.

SUMMARY OF THE INVENTION

In view of the foregoing, an object of the present invention is to provide a nitride semiconductor light emitting device stable in light output and exhibiting favorable self pulsation characteristics without thermal hysteresis during the growing step.

The nitride semiconductor light emitting device of the present invention includes at least a substrate, an active layer formed of a nitride semiconductor containing mainly In and Ga, a p-electrode, and an n-electrode, wherein at least one of the p-electrode and the n-electrode is electrically separated into at least two regions. The nitride semiconductor light emitting device of the present invention has the p-electrode and the n-electrode electrically short-circuited in at least one of the regions of the separated electrode.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1A and 1B show an example of a nitride semiconductor light emitting device of the present invention, wherein FIG. 1A is a vertical sectional view parallel with the cavity of the nitride semiconductor light emitting device, and FIG. 1B is a sectional view vertical with respect to the cavity.

FIG. 4 shows the results of calculated values of a band structure in the neighborhood of a p-n junction in a non-bias state of a nitride semiconductor light emitting device.

FIGS. 8A and 8B show an example of a nitride semiconductor light emitting device of the present invention employing a block structure, wherein FIG. 8A is a vertical sectional view parallel with the cavity of the nitride semiconductor light emitting device, and FIG. 8B is a sectional view vertical with respect to the cavity.

FIGS. 9A and 9B show an example of a nitride semiconductor light emitting device of the present invention in which electrical short-circuiting between a second p-electrode and n-electrode is conducted by a simple method, wherein FIG. 9A is a vertical sectional view parallel with the cavity of the nitride semiconductor light emitting device, and FIG. 9B is a sectional view vertical with respect to the cavity.

FIGS. 11A and 11B show an example of a nitride semiconductor light emitting device of the present invention with the substrate type altered, wherein FIG. 11A is a vertical sectional view parallel with the cavity of the nitride semiconductor light emitting device, and FIG. 11B is a sectional view vertical with respect to the cavity.

FIGS. 12A and 12B show an example of a nitride semiconductor light emitting device of the present invention having the substrate type altered and with a reflection film formed, wherein FIG. 12A is a vertical sectional view parallel with the cavity of the nitride semiconductor light emitting device, and FIG. 12B is a plan view viewed from above.

FIGS. 13A and 13B show an example of a nitride semiconductor light emitting device of the present invention with a spacer layer formed, wherein FIG. 13A is a vertical sectional view parallel with the cavity of the nitride semiconductor light emitting device, and FIG. 13B is a sectional view vertical with respect to the cavity.

DESCRIPTION OF THE PREFERRED EMBODIMENTS

<Nitride Semiconductor Light Emitting Device>

Figure 1A:
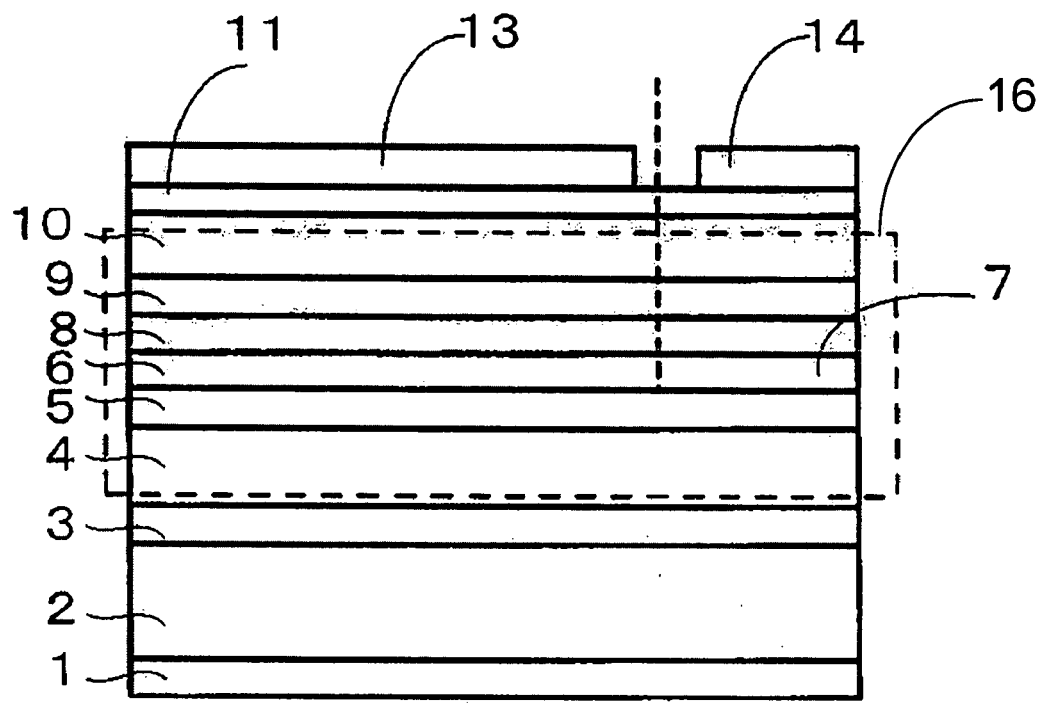

A nitride semiconductor light emitting device of the present invention has, in principle, a structure in which an n-electrode is provided on the surface of a substrate at one side, and an n type nitride semiconductor layer, an n type nitride semiconductor clad layer, an n type nitride semiconductor guide layer, an active layer formed of a nitride semiconductor containing mainly In and Ga, a p type nitride semiconductor carrier block layer, a p type nitride semiconductor guide layer, a p type nitride semiconductor clad layer, a p type nitride semiconductor contact layer, an insulation layer, a p-electrode, and the like are sequentially layered on the surface of the substrate at the other side, as will be described appropriately hereinafter. In such a structure, at least one of the p-electrode and n-electrode is electrically separated into two or more regions. By virtue of this structure, the nitride semiconductor light emitting device of the present invention has the self pulsation characteristics that will be described afterwards. The nitride semiconductor light emitting device of the present invention can exhibit further favorable self pulsation characteristics by having the p-electrode and the n-electrode electrically short-circuited in at least one of the regions of the separated electrode. A nitride semiconductor laser device can be cited as a nitride semiconductor light emitting device of the present invention.

<Substrate>

Any type of substrate employed in this field of application can be used as the substrate in the present invention. Such substrates include, but are not limited to, a GaN substrate, a sapphire substrate, an SiC substrate, a GaAs substrate, an Si substrate, a $ZrB_2$ substrate, and the like.

The substrate employed in the present invention has its thickness preferably adjusted to be as thin as approximately 100–400 μm by removing a portion of the substrate from the back side through grinding or etching. This is to facilitate the division of a wafer to obtain discrete laser chips in a subsequent processing step. Particularly in the case where a laser end surface mirror is also formed during the dividing step, it is desirable to adjust the thickness of the substrate to approximately 80–300 μm.

<Multilayered Structure>

The nitride semiconductor light emitting device of the present invention has a structure in which the above-described substrate has an n-electrode formed on one surface, and an n type nitride semiconductor layer, an n type nitride semiconductor clad layer, an n type nitride semiconductor guide layer, an active layer formed of a nitride semiconductor containing mainly In and Ga, a p type nitride semiconductor carrier block layer, a p type nitride semiconductor guide layer, a p type nitride semiconductor clad layer, a p type nitride semiconductor contact layer, an insulation layer, a p-electrode, and the like sequentially layered in this order on the other side surface. Epitaxial growth can be exemplified as one multilayering method. However, the present invention is not limited to this method. Epitaxial growth is a method of growing a crystal film on a substrate, and includes the VPE (Vapor Phase Epitaxy) method, CVD (Chemical Vapor Deposition) method, MOVPE (Metal Organic Vapor Phase Epitaxy) method, MOCVD (Metal-Organic Chemical Vapor Deposition) method, Halide-VPE (Halide Vapor Phase Epitaxy) method, MBE (Molecular Beam Epitaxy) method, MOMBE (Metal Organic Molecular Beam Epitaxy) method, GSMBE (Gas Source Molecular Beam Epitaxy) method, CBE (Chemical Beam Epitaxy) method, and the like.

For example, an n type GaN layer, an n type AlGaN layer and the like can be cited as the aforementioned n type nitride semiconductor layer. An n type AlGaN clad layer and the like can be cited as the n type nitride semiconductor clad layer. An n type GaN guide layer, an n type AlGaN guide layer, and the like can be cited as the n type nitride semiconductor guide layer. A p type AlGaN carrier block layer and the like can be cited as the p type nitride semiconductor carrier block layer. A p type GaN guide layer, a p type AlGaN guide layer and the like can be cited as the p type nitride semiconductor guide layer. A p type AlGaN clad layer and the like can be cited as the p type nitride semiconductor clad layer. A p type GaN contact layer, a p type AlGaN contact layer and the like can be cited as the p type nitride semiconductor contact layer. A layer selected from at least one dielectric of $SiO_2$, $ZrO_2$, SiO, $Ta_2O_5$, $TiO_2$, $Al_2O_3$, and the like, or a mixed layer of at least two dielectrics thereof can be cited as the insulation layer. It will be understood that such citations are merely exemplary, and are not exclusive. Respective well known layers can be employed. Description of the electrode and the active layer formed of a nitride semiconductor containing mainly In and Ga will be provided afterwards.

The nitride semiconductor light emitting device of the present invention can also have another layer such as a spacer layer further stacked, in addition to the above-described layers. For such a spacer layer, AlGaN of the n type (the percentage content of Al is preferably 0.05 at most to maintain appropriate injection efficiency in the active layer), GaN, or InGaN (the percentage content of In is preferably equal to that of the barrier layer in the active layer, allowing increase of the injection efficiency into the active layer) can be employed. Preferably, Si is added as the n type impurities. The Si concentration in such a case is preferably $1\times10^{17}/cm^3$ to $5\times10^{18}/cm^3$ as the average with the active layer. Adjustment of the spacer layer to the thickness of 0 nm to 50 nm allows the ratio of the saturable absorber contained in the depletion layer to be controlled, whereby the carrier lifetime of the saturable absorber can be modified.

<Active Layer Formed of Nitride Semiconductor Containing Mainly In and Ga>

The nitride semiconductor light emitting device of the present invention is characterized in the active layer formed of a nitride semiconductor containing mainly In and Ga in the above-described multilayered structure. As to the nitride semiconductor containing mainly In and Ga in the present specification, it is assumed that the amount of In and Ga preferably occupies at least 99% in atomicity in the component excluding nitrogen, and can additionally include impurities whose type are not particularly limited and may differ. Al of 1% at most may be mixed.

In the case where an electrode is separated into regions and a separated electrode is short-circuited with the companion electrode as will be described afterwards, the active layer of the present invention functions as a saturable absorber below the separated electrode with short circuit. The saturable absorber in the present invention is a substance exhibiting absorption at an appropriate wavelength, and has a variable absorption coefficient of light. It shows the tendency of having a smaller absorption coefficient by absorbing a large amount of photons. In the following description, it is assumed that the recitation of "saturable absorber" includes respective cases of referring to only an active layer, and referring to a saturable absorption region of the entire multilayered region, unless otherwise stated. Such a saturable absorber is not limited to one, and may be two or more. The self pulsation characteristics that will be described later depends upon the summation $\Gamma_{S.A.}$ of the confinement coefficient of the entire saturable absorber. The summation $\Gamma_{S.A.}$ of the confinement coefficient is preferably $0.02 \leq \Gamma_{S.A.} \leq 0.30$. This is because the self pulsation characteristics cannot be readily achieved due to the low absorption coefficient when the confinement coefficient is lower than 0.02. If the confinement coefficient exceeds 0.30, the lasing threshold will be increased due to the high absorption coefficient.

Since such an active layer functions as a saturable absorber in the present invention, the self pulsation characteristics described afterwards will be exhibited and the self pulsation characteristic can be altered even after wafer growth. Therefore, the present invention is advantageous in that the semiconductor light emitting device is more immune to variation during growth as compared to a self pulsation type nitride semiconductor laser with the conventional saturable absorption layer. The nitride semiconductor light emitting device of the present invention with the saturable absorber can be fabricated extremely easily, which in turn allows reduction in costs.

The active layer formed of a nitride semiconductor containing mainly In and Ga of the present invention preferably has a bandgap of at least 2.6 eV, as will be described later. Also preferably, the active layer has Si added as n type impurities, wherein the concentration of that Si is $1\times10^{17}/cm^3$ to $5\times10^{18}/cm^3$.

<Electrode>

The nitride semiconductor light emitting device of the present invention has a structure with an n-electrode and a p-electrode sandwiching the above-described substrate from above and below. The n-electrode can be formed by vapor-depositing a thin metal film on one side surface of the substrate after the grinding and/or polishing process of the substrate. A multilayered electrode structure of Hf/Al/Mo/Pt/Au, and the like can be cited as an example of the n-electrode of the present invention. This example is not to be taken by way of limitation. Vacuum evaporation is suitable for forming such a thin metal film with favorable controllability in thickness. However, other techniques are possible such as ion plating and sputtering. With regards to the p-electrode, a multilayered electrode of Pd/Mo/Au, for example, can be formed on a p type nitride semiconductor contact layer of the above-described substrate. A formation method similar to that employed for the n-electrode can be employed for the p-electrode. A favorable ohmic electrode can be obtained by applying an annealing process at 500° C. after the metal film is formed for the purpose of improving the characteristics of the p- and n-electrodes. This annealing process can be carried out respectively after the steps of p-electrode formation and n-electrode formation. In the event of an n-electrode composed of the aforementioned H/Al/Mo/Pt/Au, annealing can be applied after deposition of Al, followed by deposition of Mo/Pt/Au.

<Region Separation>

The light emitting device of the present invention is characterized in that at least one of the p- and n-electrodes is electrically separated into at least two regions. In the present specification, "electrically separated into at least two regions" includes the case where the above-described metal electrode is separated into two or more regions in the direction of stripes (lateral direction), and where the nitride semiconductor layer from the above-described active layer to the electrode is separated into two or more regions in the direction of the stripes, integrally with the electrode. Such separation can be effected by masking the underlying layer of the electrode in advance during the electrode formation step to form two or more electrodes in separated regions, or by separating the electrode formed integrally in advance through laser scribing, laser ablation, and the like.

<Short-Circuit>

The present invention is characterized in that at least one of the p-and n-electrodes is electrically separated into at least two regions, as described above, and a p-electrode and n-electrode are electrically short-circuited in at least one of the regions of the separated electrode. In the present specification, "p-electrode and n-electrode are electrically short-circuited in at least one of the regions of the separated electrode" refers to the case where the electrode in at least one of the regions is short-circuited with the companion electrode (if the separated electrode is a p-electrode, the companion electrode is the n-electrode). This short-circuiting across the two electrodes is preferable for the active layer below the separated electrode with short circuit to function as a saturable absorber. This short-circuiting can be effected by, for example, wire bonding. However, other techniques are possible such as establishing connection between the electrodes by some conductive material.

<Resistor>

The present invention can have a resistor provided between the p-electrode and the n-electrode in at least one of the regions of the electrode electrically separated into at least two regions. As to the resistor of the present invention, connection can be established across the p-n electrodes by a general resistor as long as the self pulsation characteristics described afterwards can be exhibited. The resistor of the present invention serves to adjust the self pulsation characteristics described afterwards.

<Resonator and Reflection Film (Short Circuit)>

The present invention is characterized in that one of the electrodes electrically separated into at least two regions is brought into contact with one of the two mirror facets forming a cavity at the side opposite to the output side, wherein the mirror facet includes a reflection film containing a conductive material, and the p-and n-electrodes are electrically connected by the reflection film. The self pulsation characteristics described later can be achieved by establishing connection across the p-n electrode through a general resistor as described previously, which in case will inevitably increase the number of the fabrication steps and size of the package. It is therefore preferable to have the p- and n-electrodes electrically connected by a reflection film containing a conductive material. Al is particularly preferable for such a reflection film. Reflectance of at least 80% can be achieved by directly forming a reflection film of Al on the end surface of the nitride semiconductor light emitting device. The Al in a reflection film may be located in stripes, in which case induces the possibility of electrical disconnection. A thin Al film inhibited in electrical disconnection can be provided by depositing the Al on a thin layer of material such as of Ni that has a high coating capability and a tendency to be formed in stripes. Also, a film of high reflectance based on a combination of a dielectric material and a conductor material may be employed to prevent end surface loss. Such a reflection film can be formed of a conductive material other than Al. For example, Ag can be cited as such a conductive material. The conductive material of Al or the like in the reflection film can be used in combination with a dielectric. A reflection film including a dielectric has a material of low refractive index and a material of a high refractive index combined for every ¼ optical wavelength. A conductive material such as Al can be located at the end, as long as electrical contact between the second p-electrode and the conductive material is ensured. Such a dielectric material includes $SiO_2$, $TiO_2$, $Ta_2O_5$, $Al_2O_3$, $ZrO_2$, and the like.

Although the above-described reflection film is formed depending upon the system, a rear reflection film of at least 80% in reflectance at the back plane is generally desirable. Particularly in the case where a light receiving device for detecting light output is not provided further behind the back plane, a reflection film of at least 90% in reflectance should be provided. Accordingly, the lasing threshold value is reduced since the photon density in the nitride semiconductor light emitting device becomes higher. This film of high reflectance can be formed by alternating materials of low refractive index and high refractive index at the layer thickness of 4/λ. The aforementioned $SiO_2$, $TiO_2$, $Ta_2O_5$, $Al_2O_3$ and $ZrO_2$ can be employed therefor.

The resistance across the p-n electrodes can be adjusted by controlling the film thickness of the reflection film. Also, by increasing the internal electric field of the depletion layer by selecting a higher impurity concentration or shortening $\tau_1$ sufficiently as will be described afterwards, the self pulsation characteristics can be controlled. It is expected that the yield can be improved since the self pulsation characteristics can be modified at the last stage of the fabrication process of the nitride semiconductor light emitting device.

Any resonator employed in this field of application can be used as the resonator of the present invention. For example, a Fabri-Perot resonator can be employed.

<Self Pulsation Characteristics>

The nitride semiconductor light emitting device of the present invention is characterized in exhibiting self pulsation characteristics. In the present specification, "self pulsation characteristics" refer to the phenomenon of light intensity oscillating spontaneously during DC injection by the interaction of the active layer and the saturable absorber in the nitride semiconductor light emitting device. In a self pulsation state, the noise caused by interaction with the externally fed back light (simply referred to as optical feedback noise) due to the lower coherence of the laser beam will be reduced. In order to prevent cessation of the self pulsation characteristics by the interaction of the fed back light and the saturable absorber, the absorbing region of the saturable absorber is to be positioned farther away from the output plane, whereby the effect set forth above can be further improved.

To allow exhibition of self pulsation characteristics in the nitride semiconductor light emitting device with a saturable absorber in the present invention, the product of at least the carrier lifetime of the saturable absorber, the confinement coefficient of the saturable absorber, and the linear inclination gain must be increased. Since the confinement coefficient is merely a matter of design in the multielectrode type nitride semiconductor light emitting device of the present invention, control of the carrier lifetime becomes a crucial parameter. The self pulsation characteristics can be controlled on occasions when the carrier lifetime can be adjusted to approximately 0.1 ns to 1.5 ns.

The majority carriers of the active layer formed of a nitride semiconductor containing mainly In and Ga of the n type or the type with n type impurities intentionally not added are electrons. A p-n junction is often provided between the active layer and the p layer. The p-n junction corresponds to a depletion layer in the saturable absorber since it takes a non-bias state. FIG. 4 shows an example of calculated values in the neighborhood of the p-n junction in a non-bias state in a nitride semiconductor light emitting device. In the present calculation, the active layer formed of a nitride semiconductor containing mainly In and Ga corresponding to the 3MQW (multiple quantum well) is set as the n type, whereas the AlGaN carrier block layer is set as the p type. As apparent from FIG. 4, both the active layer and the carrier block layer are depletion layers. Carriers generated by photoexcitation in such an active layer are affected by the electric field such that electrons are accelerated towards the n layer and holes are accelerated towards the p layer. In the case where the active layer is partially located outside the depletion layer, electrons are accumulated in the conduction band whereas holes are diffused as far as the depletion layer and accelerated to be accumulated in the p layer. In the case where the p-n electrodes attain an open state, potential difference occurs between the p-n electrodes by carrier diffusion. Accordingly, a current flow is generated in the case where the p-n electrodes are electrically short-circuited as described above. This operation of a saturable absorber is well known as a photodiode.

A GaAs-base example of such a multielectrode type semiconductor light emitting device, differing in material from the present invention, is proposed (aforementioned Japanese Patent Laying-Open No. 1-251775). It has been found that the active layer functioning as a saturable absorber in a non-bias state greatly depends on the material as well as the structure. Self pulsation characteristics cannot be achieved by just providing an active layer and a saturable absorber in the direction of the cavity. Namely, a semiconductor laser of a different material requires a different design for every material.

In view of a relatively small differential gain for a nitride semiconductor laser and difficulty of carrier diffusion in the active layer, it is considered that self pulsation characteristics cannot be achieved by just providing an active layer and a saturable absorber in the direction of the cavity. However, by virtue of the nitride semiconductor having a large band gap, as compared to the GaAs-base semiconductor, to allow a higher internal electric field in the depletion layer generated at the p-n junction, it is expected that the shortcoming of the aforementioned nitride semiconductor can be compensated for. Attention is focused on this difference in the present invention to provide a self pulsation structure in a semiconductor laser having a large band gap such as a nitride semiconductor. The nitride semiconductor light emitting device of the present invention exhibits self pulsation characteristics in the light output range of at least 5 mW by appropriately selecting the material and structure in the proximity of the p-n junction.

In a GaAs-base semiconductor laser (the aforementioned Japanese Patent Laying-Open No. 1-251775), the internal electric field was increased in some cases by applying a reversed bias V (<0) across the p-electrode and n-electrode of the saturable absorber. This is because the diffusion potential $V_D$ is low with a semiconductor material of a narrow bandgap such as GaAs, whereby the internal electric field of the depletion layer in FIG. 4 is reduced to result in a deteriorating effect on carrier acceleration in the depletion layer. In contrast, the nitride semiconductor employed in the present invention has a wide bandgap of approximately 2.6 eV to 3.4 eV, advantageous in that the diffusion potential is great. There is the advantage that internal electric field can be increased even in a non-bias state. The present invention is characterized in that a material having such a wide bandgap is employed. Thus, the active layer formed of a nitride semiconductor containing mainly In and Ga of the present invention preferably has a bandgap of at least 2.6 eV.

Since the width of the depletion layer and the internal electric field of FIG. 4 can be readily modified by altering the electron density in the active layer and the peripheral n layer and the hole density in the p layer, the carriers generated by photoexcitation can be promptly discharged to the n and p layers by increasing the internal electric field on the saturable absorber. Also, the carrier lifetime of the saturable absorber can be adjusted by modifying the ratio of the saturable absorber included in the depletion layer. The carrier lifetime can also be adjusted by modifying the layer thickness of the saturable absorber, or the distance to the p-n junction. In view of such characteristics of the saturable absorber, it is preferable to design the device so as to suppress increase of the carrier injection efficiency in the active layer, the driving voltage, and the like. Since a p type nitride semiconductor has a high resistance, it is preferable to add Mg by $5\times10^{19}/cm^3$ to $2\times10^{20}/cm^3$ as the p type impurities taking into account the driving voltage of the active layer. In the active layer, the spacer layer located between the active layer and the p layer, or the region from the p-n junction to the active layer, it is preferable to have Si added by an average of $1\times10^{17}/cm^3$ to $5\times10^{18}/cm^3$ as the n type impurity. If the Si impurities are less than $1\times10^{17}/cm^3$, the internal electric field of the saturable absorber will be reduced to result in the deterioration in achieving self pulsation characteristics. If the amount of Si is greater than $5\times10^{18}/cm^3$, the width of the depletion layer in the n layer will become narrower to result in reduction of the ratio of the saturable absorber included in the depletion layer. This will lead to deterioration in achieving self pulsation characteristics. The n type impurities and p type impurities are not limited to those cited above. Any impurity that exhibits a similar characteristic as a semiconductor can be used. The layer thickness of the active layer and saturable absorber is preferably not more than 100 nm. If the layer becomes thicker than 100 nm, it will become difficult to achieve self pulsation characteristics due to the lower ratio of the saturable absorber included in the depletion layer. The layer thickness of the saturable absorber and active layer refers to the distance from one end to the other end of the well layers located at both ends. The distance from the p-n junction to the active layer and saturable absorber is preferably not more than 50 nm. This is because self pulsation characteristics cannot be easily achieved since the ratio of the saturable absorber included in the depletion layer will become smaller if the distance becomes larger than 50 nm.

The carriers generated by photoexcitation in the well layer of the saturable absorber are reduced by the radiative transition and non-radiative transition in the well layer, and the tunneling effect outside the well layer. The nonradiative recombination probability should be set low in order to increase the quantum efficiency of the active layer. The aforementioned tunneling effect is preferably employed to set the carrier lifetime in the saturable absorber to 0.1 ns to 1.5 ns. In the case where the saturable absorber is located in a depletion layer as shown in FIG. 4, tunneling from the well layer to the barrier layer is promoted since the barrier layer of the saturable absorber is great to cause band bending. Therefore, a high internal electric field is required. The above-described advantage is achieved if the well layer width of the saturable absorber and active layer is smaller than the spread of electrons. Thus, the width of the well layer is preferably 0.5 nm to 5.0 nm. The well layer formed of a nitride semiconductor containing mainly In and Ga is subjected to compression strain by the nitride semiconductor containing Ga corresponding to the substrate and the nitride semiconductor containing Al and Ga, whereby the band is bent towards the p layer side such that the energy becomes lower. In other words, the holes in the well layer are biased towards the n layer side to impede tunneling towards the barrier layer at the p layer side. Particularly in the case where the well layer width is larger than 5.0 nm, bias in the carrier distribution will be so great that the tunneling effect is reduced. Therefore, it will become difficult to obtain self pulsation characteristics. If the InGaN layer is formed at less than 0.5 nm, planarization is deteriorated since In has an atomic radius larger than that of Ga and N, resulting in a smaller differential gain. Therefore, the characteristics of the active layer are deteriorated, and control of the absorption characteristics of the saturable absorber is not feasible.

An open state across the p-n electrodes will cause the electrons and holes generated by photoexcitation to be accumulated in the n layer and p layer, respectively. If the carrier density of the n and p layers is increased, the aforementioned tunneling effect cannot be expected. Accordingly, the carrier lifetime of the saturable absorber will become longer to impede self pulsation. In view of the foregoing, the carriers must be eliminated promptly across the p-n electrodes.

By establishing short-circuiting across the p-n electrodes or by providing a resistor across the p-n electrodes, the carriers accumulated in the n layer and p layer are recombined. The carrier lifetime is determined based on a combination of several relaxation time. Let $\tau_r$ be the radiative recombination lifetime and $\tau_{nr}$ the nonradiative recombination lifetime in an active layer well, $\tau_2$ the lifetime of carriers traveling to the barrier layer from the active layer well by tunneling and diffusion, and $\tau_3$ the time constant based on the package capacitance C and series resistance R of a nitride semiconductor laser. By comparing $\tau_1$ expressed by the following equation in a stable state with $\tau_3$, the longer lifetime is dominant.

$$\frac{1}{\tau_1} = \frac{1}{\tau_r} + \frac{1}{\tau_{nr}} + \frac{1}{\tau_2}.$$

In the case where the p-n electrodes are connected with a conductive reflection film, the carrier lifetime across the p-n electrodes can be controlled by modifying the resistance through the film thickness. It is particularly advantageous to provide a thin conductor film so as to also serve as the end surface reflection film of the nitride semiconductor from the standpoint of cost and smaller package size in mass production. Also, the self pulsation characteristics can be controlled through series resistance R added with an external resistance component by increasing the impurity concentration, or shortening $\tau_1$ sufficiently, for example, to obtain a higher internal electric field in the depletion layer. Thus, it is expected that the yield can be improved since the self pulsation characteristics can be modified at the last stage of the fabrication step of a nitride semiconductor light emitting device.

<Miscellaneous>

The nitride semiconductor light emitting device of the present invention can be separated as set forth below. First, a scribe line is drawn with a diamond point on the surface. Stress is applied appropriately on the wafer to break the wafer apart along the scribe line. The scribe line may be drawn from the back side surface. Other methods can be used to separate the wafer into chips. For example, the dicing method of scratching or breaking apart using a wire saw or a thin blade, a laser scribing method of obtaining a scribe line by burning the wafer with a laser beam such as excimer laser and then generating a crack at the burned region by rapid cooling, a laser ablation method of directing a laser beam of high energy density to burn away a region to form a trench, and the like can be employed.

The present invention will be described in further detail based on respective examples. It will be understood that such description is merely exemplary, and not to be taken by way of limitation.

EXAMPLE 1

Figure 1B:
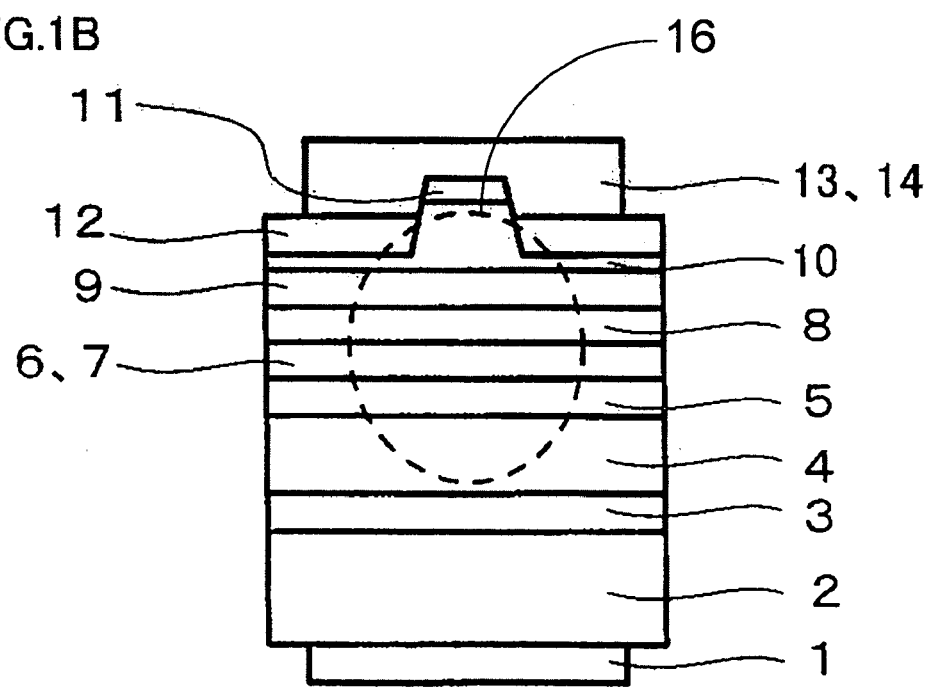

Example 1 will be described with reference to FIGS. 1A and 1B. FIG. 1A is a vertical sectional view parallel with the cavity of a semiconductor laser device identified as nitride semiconductor light emitting device of the present example, and FIG. 1B is a sectional view vertical with respect to the cavity. From the substrate side are located an n-electrode 1, a GaN substrate 2, an n type GaN layer 3, an n type AlGaN clad layer 4, an n type GaN guide layer 5, an active layer 6 formed of a nitride semiconductor containing mainly In and Ga, a saturable absorber 7 formed of a nitride semiconductor containing mainly In and Ga, a p type AlGaN carrier block layer 8, a p type GaN guide layer 9, a p type AlGaN clad layer 10, a p type GaN contact layer 11, an insulation layer 12, a first p-electrode 13, and a second p-electrode 14.

Active layer 6 formed of a nitride semiconductor containing mainly In and Ga includes a barrier layer and a well layer, constituting a multiple quantum well (MQW) structure. As shown in FIG. 1A, the p-electrode is separated into two regions, each electrode being formed 10 μm from each other. Since a p type nitride semiconductor layer has a high resistance, the active layer and the saturable absorber located below the two electrodes are electrically separated by the electrode separation. Second p-electrode 14 and n-electrode 1 are electrically short-circuited through wire bonding.

The semiconductor laser device can be fabricated as set forth below. GaN substrate 2 was placed in an MOCVD apparatus. Using $NH_3$ of Group V source material and trimethyl gallium (TMGa) of Group III source material, a low temperature GaN buffer layer was grown to 25 nm at the growth temperature of 550° C. $SiH_4$ was added to said source material at the growth temperature of 1075° C. to form n type GaN layer 3 (Si impurity concentration $1\times10^{18}/cm^3$) to 3 μm in thickness. Then, using Group III source material of trimethyl aluminum (TMAl), n type $Al_{0.1}Ga_{0.9}N$ clad layer 4 (Si impurity concentration $1\times10^{18}/cm^3$) was grown to a thickness of 1.5 μm. Subsequently, n-GaN guide layer 5 was grown to 0.1 μm in thickness.

The substrate temperature was then lowered to 725° C., and active layer (multiple quantum well structure) 6 and saturable absorber 7 formed of 5 cycles of an $In_{0.15}Ga_{0.85}N$ well layer of 3.3 nm in thickness and an $In_{0.02}Ga_{0.98}N$ barrier layer of 6.7 nm in thickness were grown in the order of barrier layer/well layer/barrier layer/well layer/barrier layer/well layer/barrier layer/well layer/barrier layer/well layer/barrier layer. During this process, the growth can be interrupted for at least 1 second and not more than 180 seconds, as desired, between a barrier layer and a well layer, or between a well layer and a barrier layer. This contributes to improving planarization of each layer and reducing the half-band width of light emission. In the present invention, the thickness of the active layer and saturable absorber refers to the well layer of one end to the well layer of the other end, as described before. Therefore, said layer thickness becomes 43.3 nm in the above case. Si was added by $5\times10^{17}/cm^3$ as the n type impurity for the active layer.

The substrate temperature was raised again up to 1050° C., and p type $Al_{0.3}Ga_{0.7}N$ carrier block layer 8 of 18 nm in thickness and p type GaN guide layer 9 of 0.1 μm were grown. Mg was added by $5\times10^{19}/cm^3$ to $2\times10^{20}/cm^3$ as the p type impurity.

Then, p type $Al_{0.1}Ga_{0.9}N$ clad layer 10 and p type GaN contact layer 11 were grown to a thickness of 0.5 μm and 0.1 μm, respectively, with the substrate temperature still at 1050° C. Mg was added at $5\times10^{19}/cm^3$ to $2\times10^{20}/cm^3$ as the p type impurity.

For respective source materials of the element forming each layer and the doped element, TMGa, TMAl, trimethyl indium (TMIn), NH$_3$, cyclopentadienyl magnesium (Cp2Mg), SiH$_4$ were employed.

Following formation of p type GaN contact layer 11, a ridge structure was formed by dry etching, and insulation layer 12 was formed at the dry-etch region. The insulation layer was formed by depositing SiO$_2$ to approximately 2000 Å and TiO$_2$ to 500 Å from the dry-etch face side. This two-layered structure was employed since SiO2 affects the mode refractive index of laser and TiO$_2$ serves to improve adherence with the electrode formed above. The masking first and second p-electrodes 13 and 14 were formed on the insulation layer in a layered structure of Pd/Mo/Au. The distance between the first p-electrode and the second p-electrode was set to 10 μm as described in the foregoing.

Then, the thickness of GaN substrate 2 was adjusted to 250 μm using a grinder and a polisher. The back side of the substrate was polished by a grinding machine to become flat. Following the grinding step, a thin metal film was vapor-deposited on the back side of GaN substrate 2 to form n-electrode 1 having a layered structure of Hf/Al/Mo/Pt/Au. The vacuum evaporation method suitable for forming such a thin metal film with controlled thickness was employed here. Following this metal film formation step, annealing was applied at 500° C. to improve the properties of the p- and n-electrodes, whereby a favorable ohmic electrode was obtained.

The semiconductor laser device fabricated as described above was separated as set forth below. A scribe line was drawn with a diamond point at the surface. The wafer was subjected to appropriate stress to be separated along the scribe line. Following this separation step, a dielectric multilayer film was provided at the mirror facet constituting a Fabri-Perot resonator to alter the reflectance. Such a reflection film is formed depending upon the system. A reflection film of at least 90% in reflectance was formed by SiO$_2$. Accordingly, the photon density in the semiconductor laser was improved, leading to reduction of the lasing threshold value.

Then, die bonding was employed to mount the laser chip on a heat sink at the stem to obtain a semiconductor laser device. The chip was firmly attached with junction-up having the n-electrode side as the junction plane. Then, second p-electrode 14 and n-electrode 1 were short-circuited through wire bonding.

The characteristics of a nitride semiconductor laser fabricated as described above was evaluated. The cavity length of the nitride semiconductor laser was 550 μm, and the stripe width was 2.0 μm. The length of the first p-electrode in the direction parallel with the cavity was 490 μm whereas the length of the second p-electrode in the direction parallel with the cavity was 50 μm. The region of separation between the two p-electrodes was 10 μm. Continuous lasing was exhibited at the threshold value of 75 mA at the room temperature of 25° C., and the emission wavelength was 405±5 nm. Examining the FFP (far field pattern), lasing was exhibited in the basic mode in both the lateral direction and vertical direction with respect to the layered plane.

Figure 2:
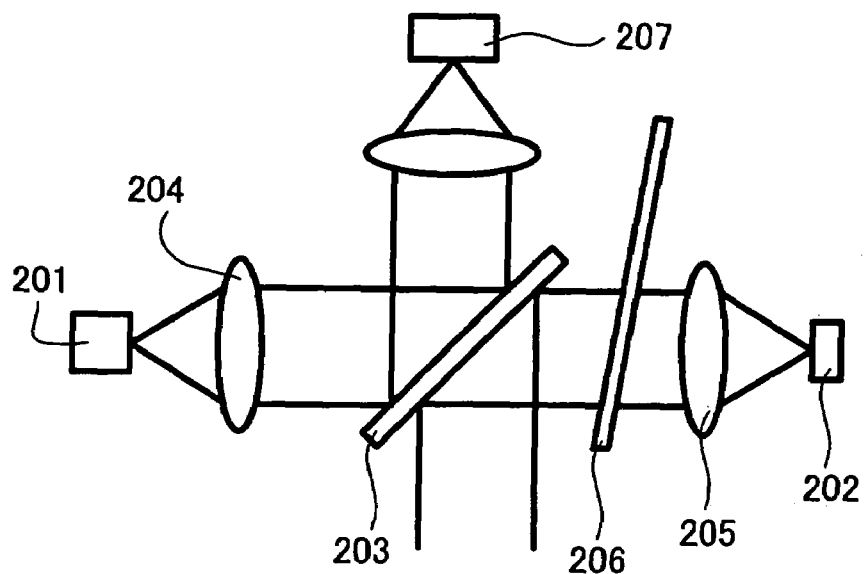
FIG. 2 is an equivalent representation of a system showing optical feedback noise.

Noise measurement was conducted with a system having optical feedback. Such a system with optical feedback is generally seen in an optical information recording device such as an optical disk system. FIG. 2 shows an equivalent reproduction of such a system. Noise caused by the phenomenon of the output laser beam being recombined with the semiconductor laser as returning light (generally term "optical feedback noise") is dominant in a system with optical feedback. The noise evaluation in the system is based on relative intensity noise (RIN). Generally, a favorable system will be referenced to RIN<−125 dB/Hz. The laser beam output from a semiconductor laser 201 is collimated at a lens 204 and divided into two beams by a half mirror 203. The transmitted light passes through an ND filter 206 and a lens 205 to be gathered at a reflecting mirror 202. The reflecting mirror is equivalent to an optical disk or the like, and the reflectance can be modified by the ND filter. The reflected light is fed back through the light path to be gathered with semiconductor laser 201. Thus, the noise measurement apparatus is a replacement of a system incorporated with a semiconductor laser for an optical disk. Relative intensity noise including optical feedback noise can be measured. The light output was observed at a light receiving device 207. The nitride semiconductor laser of the present example was evaluated using such a noise measurement apparatus. As a result, RIN<−130 dB/Hz was achieved at the light output of 5 mW.

Figure 3:
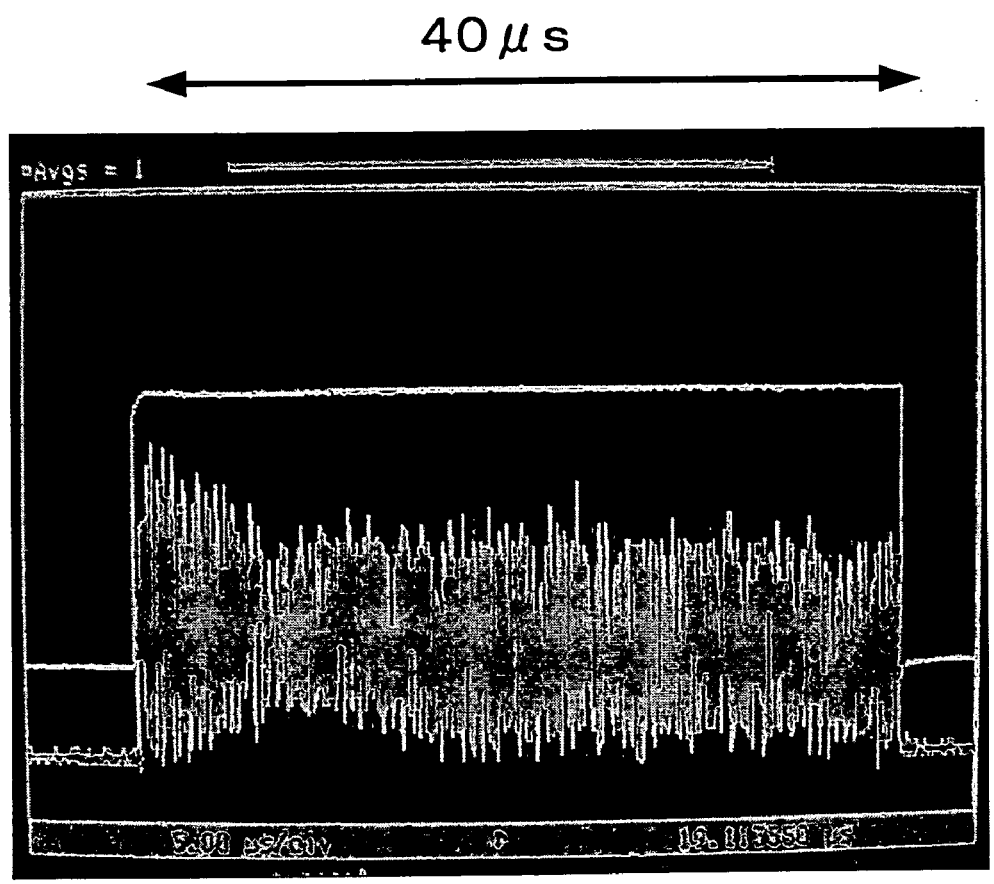
FIG. 3 shows self pulsation characteristics.

Cyclic oscillation of the laser beam was observed using a high-speed detector. FIG. 3 shows observation of self pulsation characteristics by driving with a pulse current. The input pulse and light response waveform are shown in FIG. 3. The pulse width was approximately 40 μs. Although an accurate oscillation cycle cannot be identified since the sampling time of the oscilloscope becomes shorter when observed by a wide time scale as in FIG. 3, the presence/absence of oscillation can be confirmed. A stable self pulsation as shown in FIG. 3 was achieved.

In order to evaluate the effect of short-circuiting between the p-n electrodes in the saturable absorption region, second p-electrode 14 was electrically led out by wire bonding. By rendering open the leading out terminal, an electrical open state of the second p-electrode was achieved. The lasing threshold was 60 mA when driven by a pulse current. Then, the leading out terminal was brought into electrical contact with the leading out terminal from the n-electrode, resulting in the second p-electrode being electrically short-circuited. The lasing threshold was 65 mA when driven by a pulse current. The external differential efficiency was also slightly degraded. The absorption coefficient of the saturable absorber was increased by short-circuiting the p-electrode. Specifically, it is appreciated that the carrier lifetime of the saturable absorber was shortened. It is considered that the carriers generated by photoexcitation were accumulated in the p layer and n layer due to the open state of the p-n electrodes, causing reduction of the tunneling effect of the saturable absorber from the well layer. It was identified that self pulsation was impeded when an open state is established.

Figure 5A:
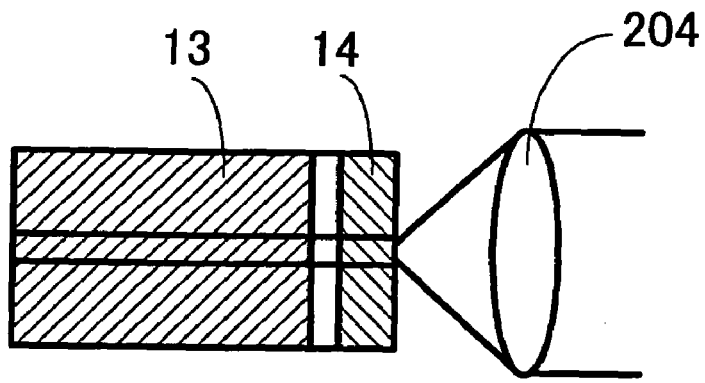
FIGS. 5A and 5B are plan views of a nitride semiconductor light emitting device of the present invention with the location of the saturable absorber modified, wherein FIG. 5A corresponds to a nitride semiconductor light emitting device having a second p-electrode located at the output plane side and FIG. 5B corresponds to a nitride semiconductor light emitting device having a second p-electrode located at the back plane side.
Figure 5B:
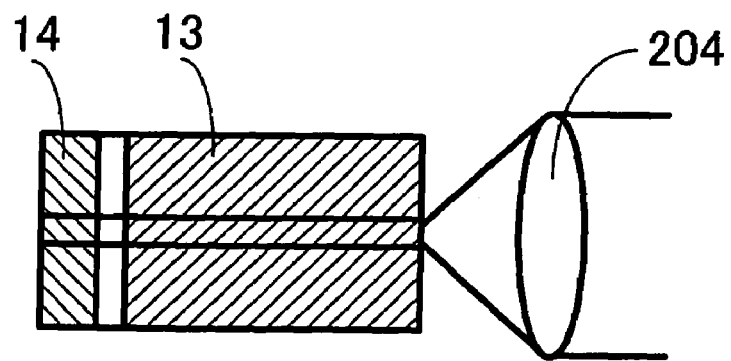
Figure 6:
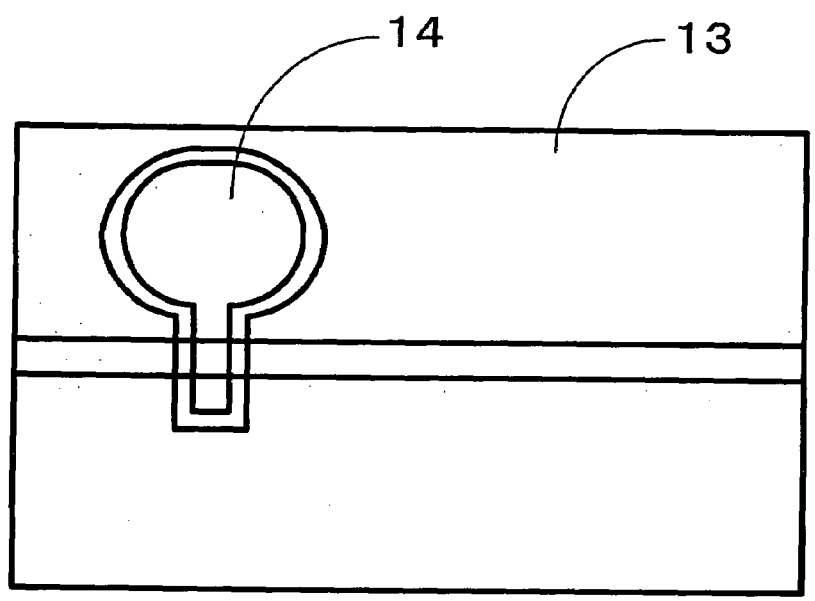
FIG. 6 shows an example of a nitride semiconductor light emitting device of the present invention having a bonding area provided at the electrode.

The position of the saturable absorber was modified as shown in FIGS. 5A and 5B. FIG. 5A corresponds to the case where second p-electrode 14 is located at the output plane side. FIG. 5B corresponds to the case where second p-electrode 14 is located at the back plane. The system noise evaluation in accordance with FIG. 2 was carried out on such two nitride semiconductor lasers with the position of the saturable absorber modified. Some of the lasers of FIG. 5A exhibited rise in the optical feedback noise as compared to those of FIG. 5B. A possible consideration is that a negative feedback occurs in self pulsation due to the relationship between the self pulsation frequency and the beat frequency of the external feedback path, causing greater noise as function of a higher optical feedback combination rate to the saturable absorber. The spot size of the fed back light at the nitride semiconductor laser output plane becomes larger than the NFP by the NA that depends upon the lens or the like of the system, whereby the combination efficiency of the optical feedback to the waveguide is deteriorated. Therefore, the combination efficiency of the saturable absorber located at the backside of the waveguide and the optical feedback shown in FIG. 5B was lower as compared to that of FIG. 5A. It was therefore appreciated that the saturable absorber is preferably located away from the output plane. The p-electrodes in FIGS. 5A and 5B show a rectangular pattern. In the case where the confinement coefficient of one of the second p-electrode and the saturable absorption region is small, a bonding area as shown in FIG. 6 should be provided since wire bonding is not feasible.

Figure 7:
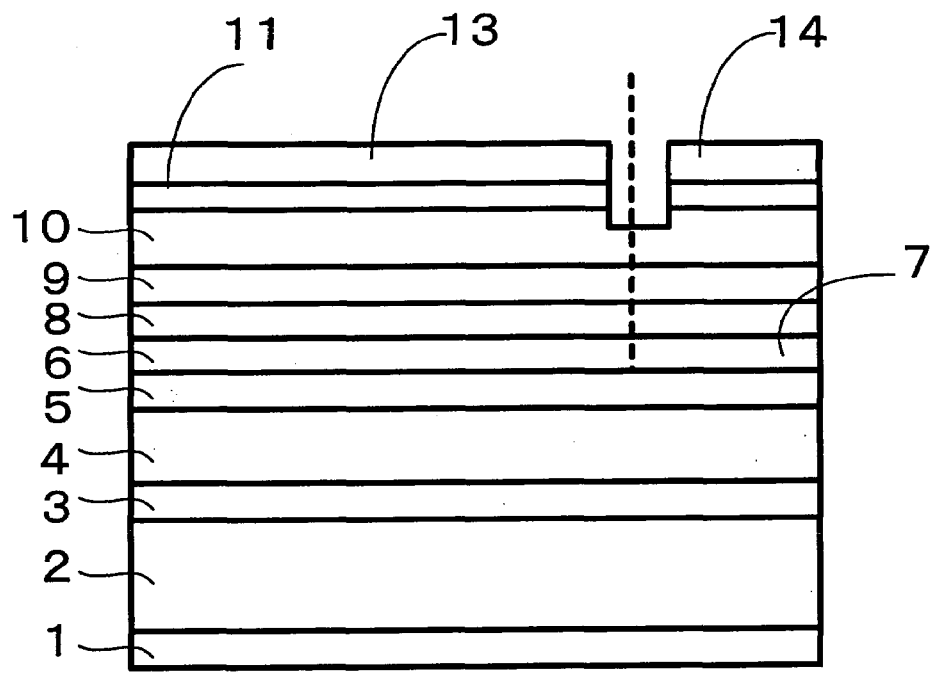
FIG. 7 shows an example of a nitride semiconductor light emitting device of the present invention having a nitride semiconductor layer as well as the electrode separated into regions.

In the present example, the active layer was separated from the saturable absorber by the p-electrode alone since the p type nitride semiconductor has a high resistance. The p type nitride layer can be also separated by etching as shown in FIG. 7. Although it is desirable to conduct etching up to the carrier block layer in electrical separation, etching as deep as to the lateral mode will induce the possibility of increase of the threshold value and decrease of the external differential efficiency due to a large emission loss of the propagation light.

EXAMPLE 2

Figure 8A:
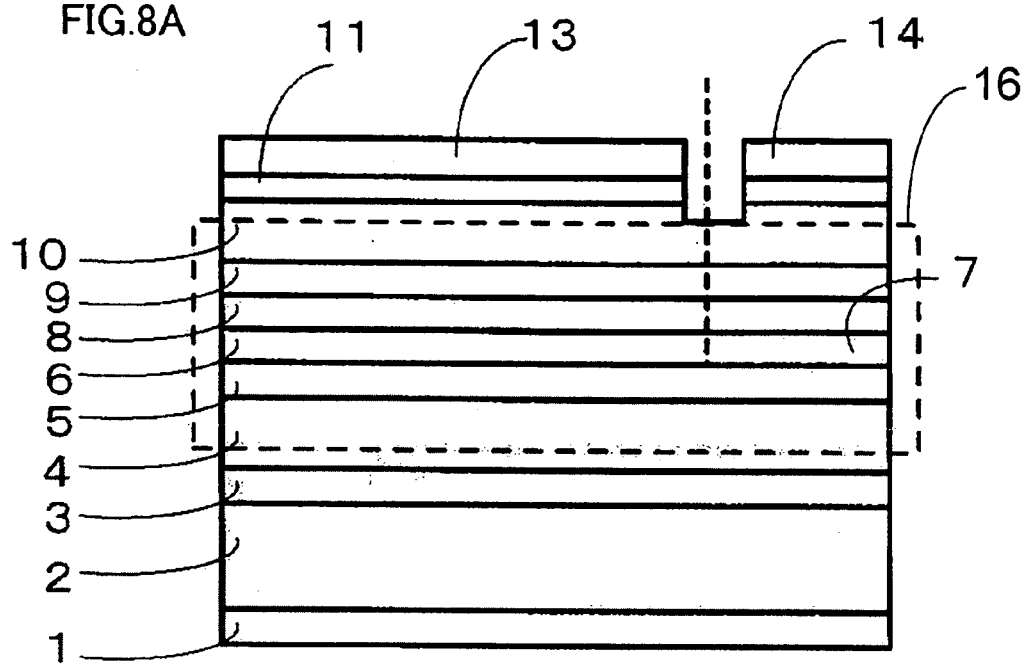
Figure 8B:
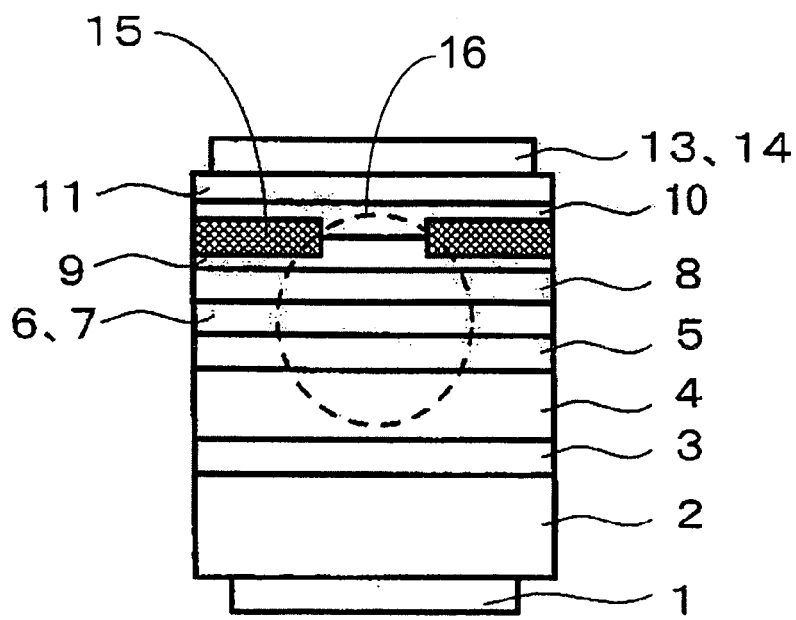

In contrast to the ridge waveguide structure of Example 1, a block structure as shown in FIGS. 8A and 8B is employed in Example 2. FIG. 8A is a vertical sectional view parallel with the cavity of a semiconductor laser device identified as nitride semiconductor light emitting device of the present example. FIG. 8B is a sectional view vertical with respect to the cavity. From the substrate side are located an n-electrode 1, a GaN substrate 2, an n type GaN layer 3, an n type AlGaN clad layer 4, an n type GaN guide layer 5, an active layer 6 formed of a nitride semiconductor containing mainly In and Ga, a saturable absorber 7 formed of a nitride semiconductor containing mainly In and Ga, a p type AlGaN carrier block layer 8, a p type GaN guide layer 9, a p type AlGaN clad layer 10, a p type GaN contact layer 11, a block layer 15, a first p-electrode 13, and a second p-electrode 14. Respective layers were fabricated in a manner similar to that described in Example 1.

The semiconductor laser device of the present invention thus obtained has a larger area for the p type contact layer due to the block structure. Therefore, leakage current may occur if electrical separation is conducted by the p-electrode alone. It is therefore desirable to etch the p layer for electrical separation as described above.

EXAMPLE 3

Figure 9A:
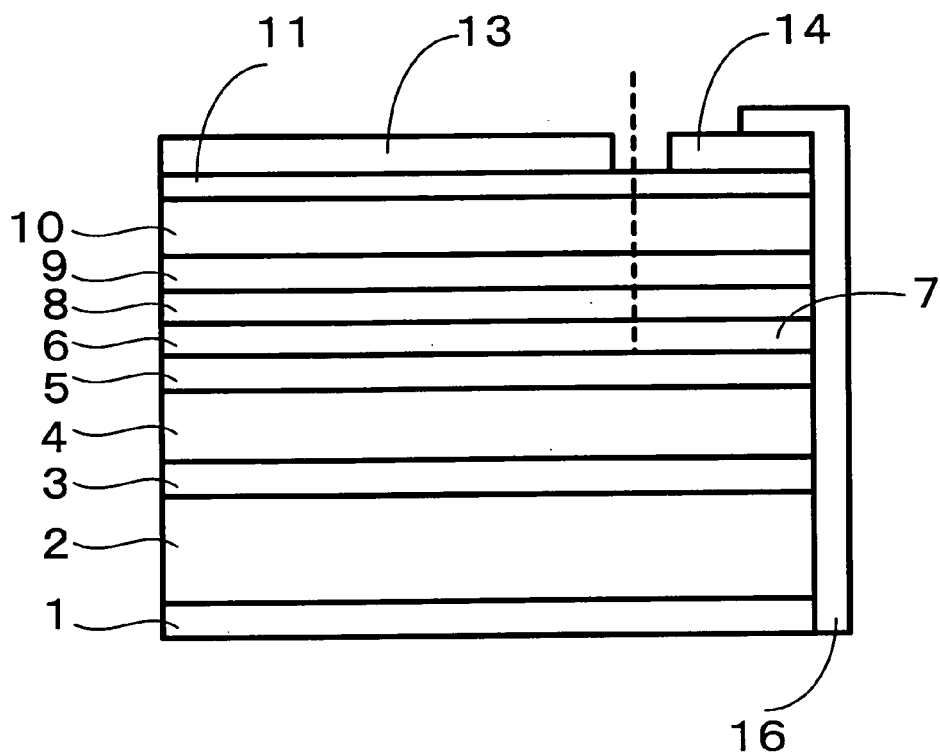
Figure 9B:
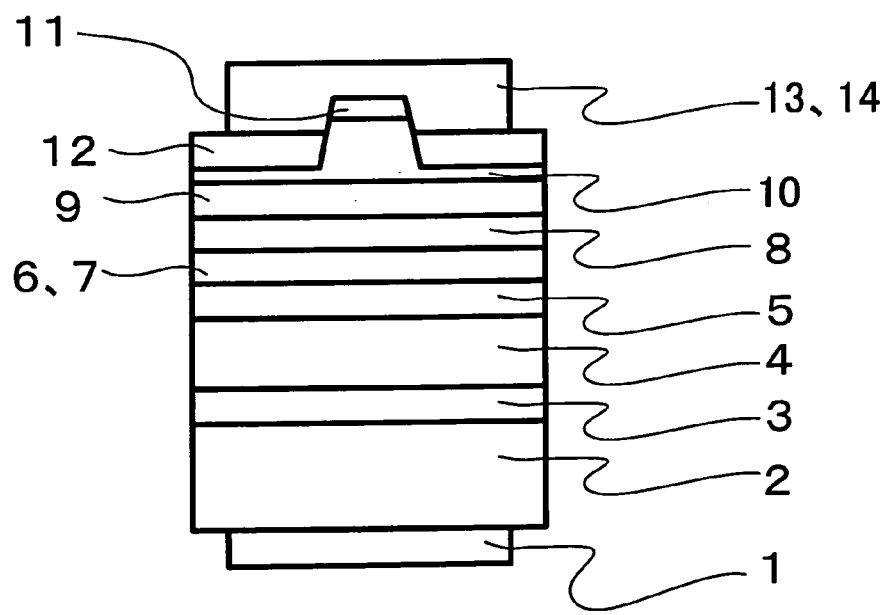

Example 3 is directed to reduce the cost by conducting the electrical short-circuiting between the second p-electrode and the n-electrode in a more simple manner than in Example 1. A semiconductor laser device identified as nitride semiconductor light emitting device of the present example is shown in FIGS. 9A and 9B. FIG. 9A is a vertical sectional view parallel with the cavity of the semiconductor laser device. FIG. 9B is a sectional view vertical with respect to the cavity. From the substrate side are located an n-electrode 1, a GaN substrate 2, an n type GaN layer 3, an n type AlGaN clad layer 4, an n type GaN guide layer 5, an active layer 6 formed of a nitride semiconductor containing mainly In and Ga, a saturable absorber 7 formed of a nitride semiconductor containing mainly In and Ga, a p type AlGaN carrier block layer 8, a p type GaN guide layer 9, a p type AlGaN clad layer 10, a p type GaN contact layer 11, a first p-electrode 13, a second p-electrode 14, and an Al reflection film 16. The fabrication process of the semiconductor laser device of Example 3 is similar to the fabrication steps of Example 1 up to formation of the electrode. The fabrication steps set forth below are additionally carried out.

At the second p-electrode side of the mirror facet constituting a Fabri-Perot resonator after separation, a reflection film 16 of Al was formed. Reflection film 16 electrically short-circuits the second p-electrode with the n-electrode due to its spread to the second p-electrode. Reduction in the threshold value is expected since the reflectance at the end surface is increased by this reflection film 16.

As shown in FIG. 9A, reflection film 16 forms contact with GaN substrate 2. Electrical contact between n-electrode 1 and reflection film 16 was ensured by the steps set forth below since there are cases where ohmic contact is not established between reflection film 16 and GaN substrate 2. In the die-bonding step, solder forms electrical contact with reflection film 16 as well as with n-electrode 1, whereby the second p-electrode and n-electrode were electrically short-circuited. Since the reaction between solder and Al is generally low, a barrier metal/reactive metal may be provided on reflection film 16 to improve electrical contact between the Al and solder. Mo, Pt, W, and the like can be cited as the barrier metal. At least one thereof is preferably included in the barrier metal. Au, Pt, Pd, Ni, and the like can be cited for the reactive metal. At least one thereof is preferably included in the reactive metal.

The nitride semiconductor laser fabricated as described above can provide advantages similar to those of the semiconductor laser of Example 1. The fabrication cost can be reduced since the step of establishing electrical short-circuiting between the second p-electrode and the n-electrode is dispensed with.

EXAMPLE 4

Figure 10:
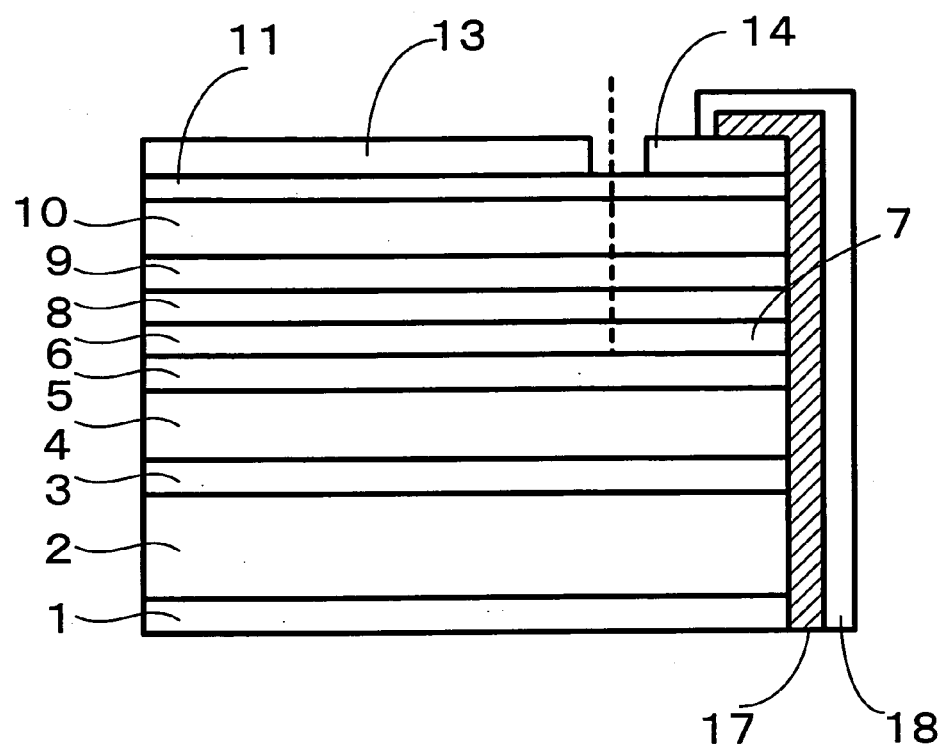
FIG. 10 shows an example of a nitride semiconductor light emitting device of the present invention in which a reflection film 17 composed of a dielectric and a reflection film 18 composed of Al are formed instead of reflection film 16 in FIG. 9A.

Example 4 is directed to form a reflection film based on the combination of a dielectric material and Al, instead of the Al employed as the reflection film in Example 3. The nitride semiconductor laser device of Example 4 will be described with reference to FIG. 10. The nitride semiconductor laser device of FIG. 10 has a structure similar to the nitride semiconductor laser device of FIGS. 9A and 9B, provided that a reflection film 17 of a dielectric and a reflection film 18 of Al are formed instead of reflection film 16 shown in FIG. 9A. An arbitrary dielectric selected from $SiO_2$, $TiO_2$, $Ta_2O_5$, $Al_2O_3$, and $ZrO_2$ can be used. Reflection film 18 formed of Al is brought into electrical contact with n-electrode 1 by solder. The nitride semiconductor laser fabricated as described in Example 4 provides advantages similar to those of Example 1. The cost can be reduced since the step of forming electrical short-circuiting between the second p-electrode and n-electrode can be dispensed with.

EXAMPLE 5

Example 5 is directed to a nitride semiconductor light emitting device having the substrate formed of GaN employed in Example 1 replaced with a sapphire substrate. The nitride semiconductor light emitting device of Example 5 will be described with reference to FIGS. 11A and 11B.

Figure 11A:
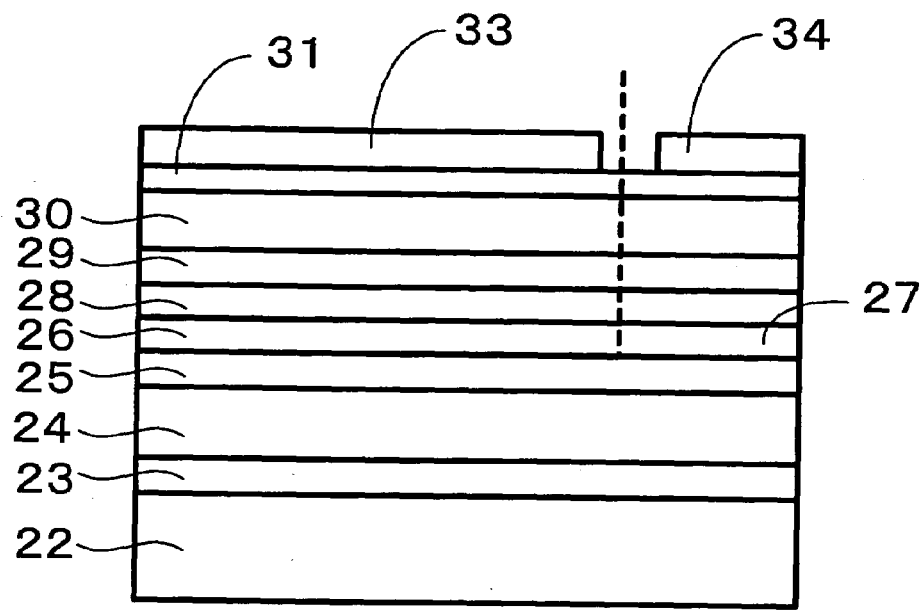
Figure 11B:
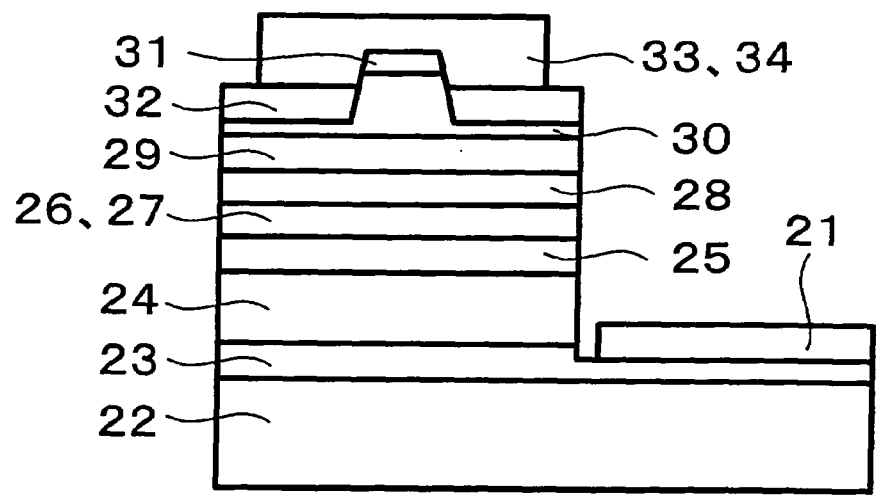

FIG. 11A is a vertical sectional view parallel with the cavity of a semiconductor laser device identified as a nitride semiconductor light emitting device of Example 5, and FIG. 1B is a sectional view vertical with respect to the cavity. From the substrate side are located an n-electrode 21, a sapphire substrate 22, an n type GaN layer 23, an n type AlGaN clad layer 24, an n type GaN guide layer 25, an active layer 26 formed of a nitride semiconductor containing mainly In and Ga, a saturable absorber 27 formed of a nitride semiconductor containing mainly In and Ga, a p type AlGaN carrier block layer 28, a p type GaN guide layer 29, a p type AlGaN clad layer 30, a p type GaN contact layer 31, an insulation layer 32, a first p-electrode 33, and a second p-electrode 34. The semiconductor laser device of Example 5 can be fabricated in a manner similar to that described in Example 1.

EXAMPLE 6

Example 6 is directed to a nitride semiconductor light emitting device having the substrate of GaN employed in Example 3 replaced with a sapphire substrate. The nitride semiconductor light emitting device of Example 6 will be described hereinafter with reference to FIGS. 12A and 12B.

Figure 12A:
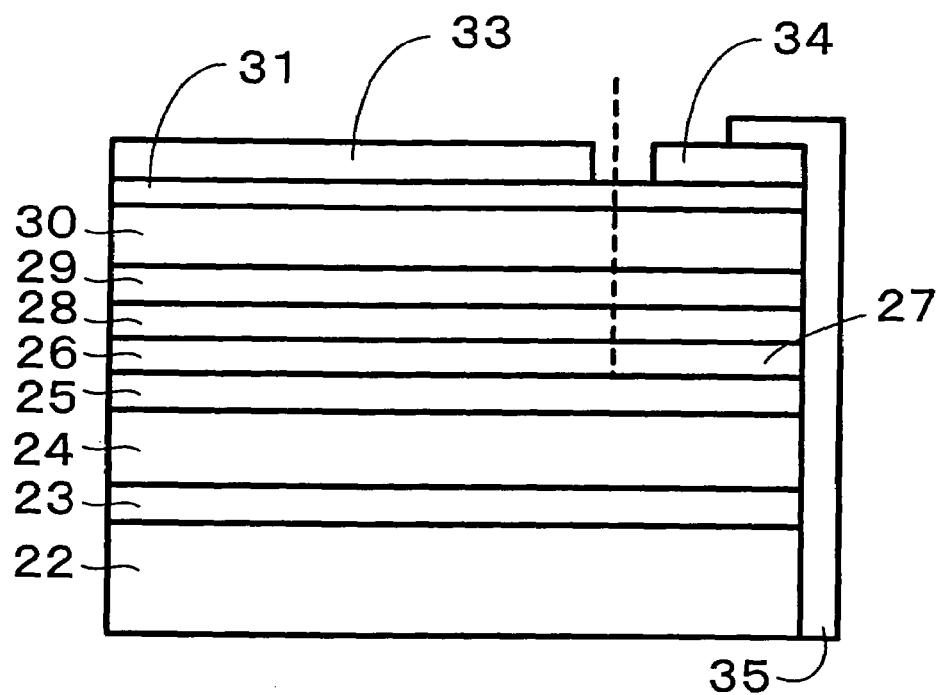
Figure 12B:
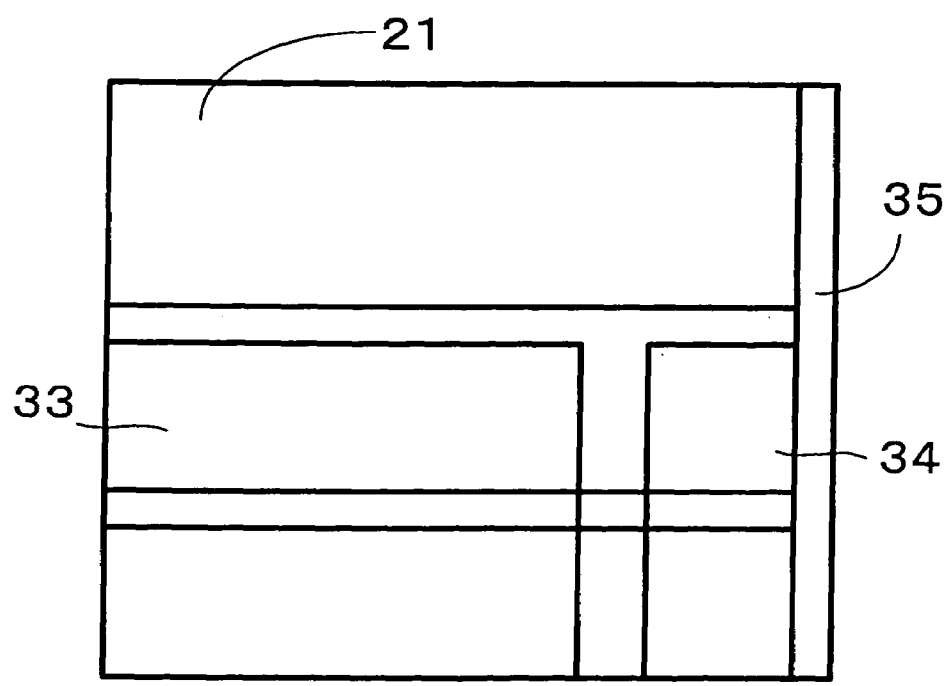

FIG. 12A is a vertical sectional view parallel with the cavity of a semiconductor laser device identified as a nitride semiconductor light emitting device, and FIG. 12B is a plan view of the semiconductor laser device of Example 6 viewed from above. From the substrate side are located an n-electrode 21, a sapphire substrate 22, an n type GaN layer 23, an n type AlGaN clad layer 24, an n type GaN guide layer 25, an active layer 26 formed of a nitride semiconductor containing mainly In and Ga, a saturable absorber 27 formed of a nitride semiconductor containing mainly In and Ga, a p type AlGaN carrier block layer 28, a p type GaN guide layer 29, a p type AlGaN clad layer 30, a p type GaN contact layer 31, an insulation layer 32, a first p-electrode 33, a second p-electrode 34, and a reflection film 35 of Al.

The nitride semiconductor light emitting device of Example 6 can be fabricated in accordance with the fabrication steps described previously for the nitride semiconductor light emitting device of Example 3. The nitride semiconductor laser thus fabricated exhibits self pulsation characteristics, and provides advantages similar to those of Example 3. Reflection film 35 can be formed of Al likewise Example 3, or of another conductive material, or combined with a reflection film of a dielectric as in Example 4.

EXAMPLE 7

Example 7 is directed to a nitride semiconductor light emitting device further including a spacer layer in the nitride semiconductor light emitting device of Example 3. The nitride semiconductor light emitting device of Example 7 will be described hereinafter with reference to FIGS. 13A and 13B.

Figure 13A:
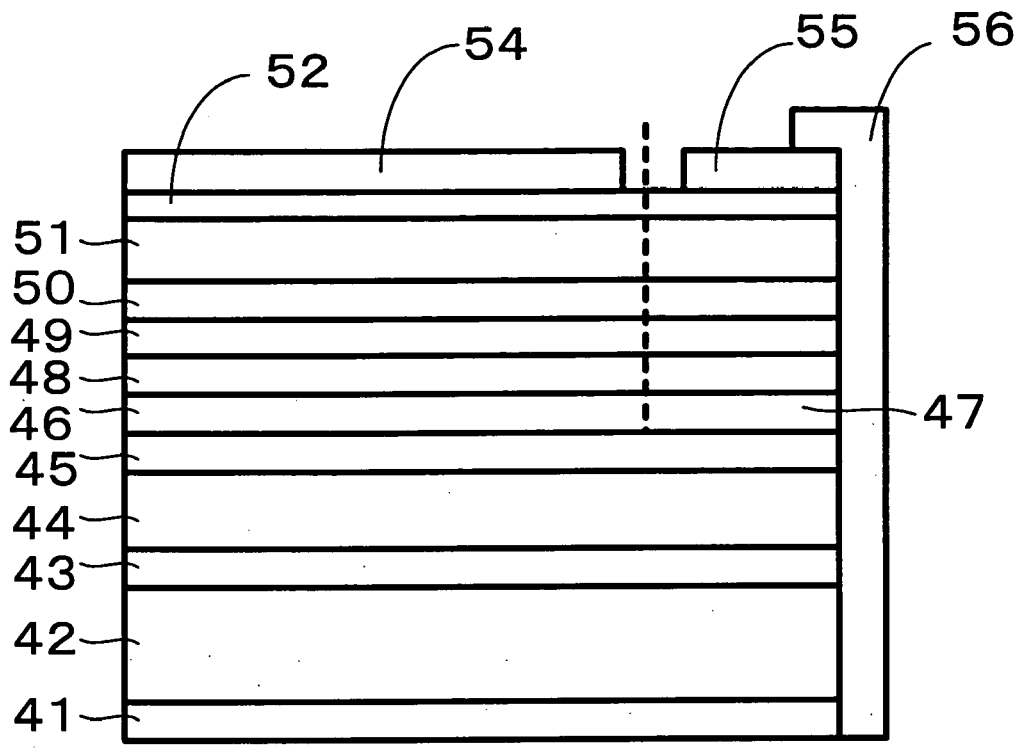
Figure 13B:
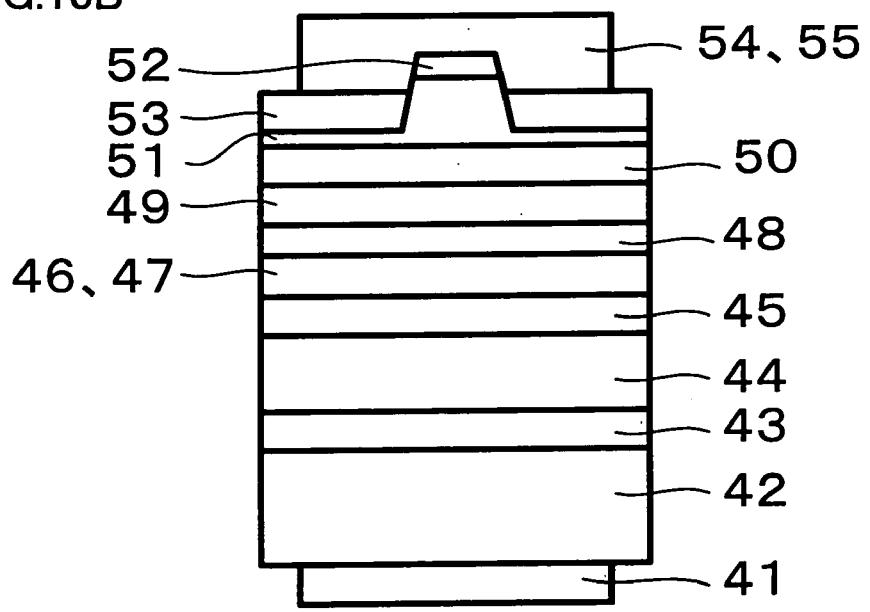
Figure 14:
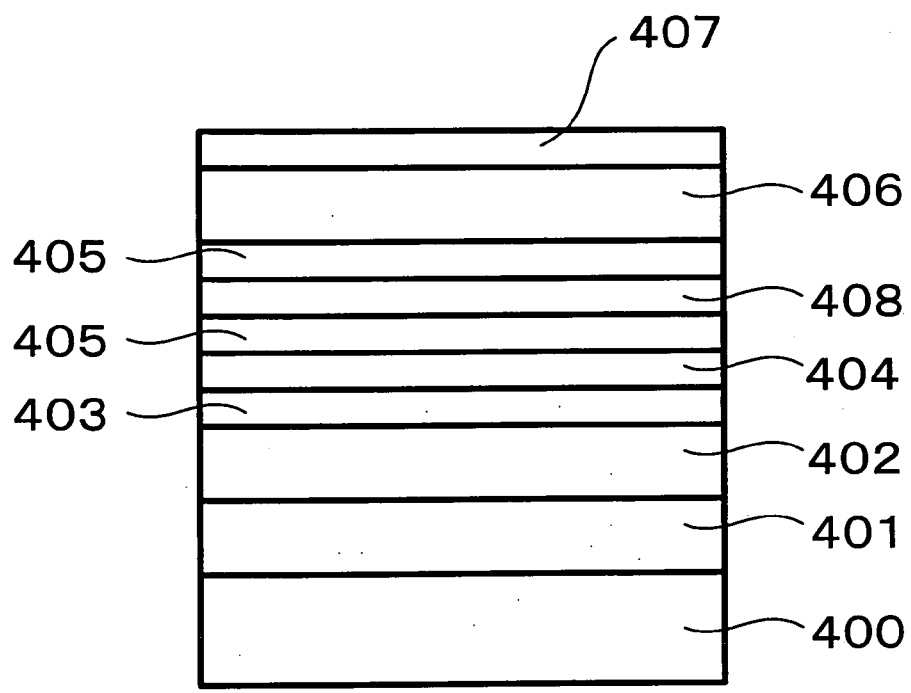
FIG. 14 is a sectional view of an example of a low noise semiconductor laser of a conventional structure for an optical disk.

FIG. 13A is a vertical sectional view parallel with the cavity of a semiconductor laser device identified as a nitride semiconductor light emitting device of Example 7, and FIG. 13B is a sectional view vertical with respect to the cavity. From the substrate side are located an n-electrode 41, a GaN substrate 42, an n type GaN layer 43, an n type AlGaN clad layer 44, an n type GaN guide layer 45, an active layer 46 formed of a nitride semiconductor containing mainly In and Ga, a saturable absorber 47 formed of a nitride semiconductor containing mainly In and Ga, an n type spacer layer 48, a p type AlGaN carrier block layer 49, a p type GaN guide layer 50, a p type AlGaN clad layer 51, a p type GaN contact layer 52, an insulation layer 53, a first p-electrode 54, a second p-electrode 55, and a reflection film 56 formed of Al.

The nitride semiconductor light emitting device of Example 7 can be fabricated in a manner similar to that of Example 3 with the exception of the additional formation of a spacer layer. An n type AlGaN (the amount of Al is preferably not more than 0.05 to maintain an appropriate injection efficiency in the active layer) can be employed for the spacer layer. Additionally, GaN or InGaN (the amount of In is preferably equal to that in the barrier layer in the active layer to set a high injection efficiency to the active layer) can also be employed for the spacer layer. Si was added as the n type impurity in the spacer layer. In this case, the concentration of Si was $1\times10^{17}/cm^3$ to $5\times10^{18}/cm^3$ as an average with the active layer. The thickness of the spacer layer is adjusted to 0 nm to 50 nm to modify the ratio of the saturable absorber included in the depletion layer, whereby the carrier lifetime in the saturable absorber can be adjusted. The nitride semiconductor light emitting device of Example 7 thus fabricated exhibits self pulsation characteristics.

EXAMPLE 8

The present example relates to a semiconductor laser identified as a nitride semiconductor light emitting device of Example 3 (FIGS. 9A and 9B) wherein the length of the cavity of the nitride semiconductor laser is 700 µm, the length of first p-electrode 13 in the cavity direction (total length L2 of the region not short-circuited among the electrode separated into regions) is 600 µm, and the length of second p-electrode 14 in the cavity direction (total length L1 of the region where the p- and n-electrodes are short-circuited among the electrode separated into regions) is 90 µm. The nitride semiconductor light emitting device of the present example can be fabricated according to Example 1. Specifically, when Pd/Mo/Au are to be deposited at the top surface of insulation layer 12 as first p-electrode 13 and second p-electrode 14, the length of respective electrodes in the stripe direction (horizontal direction) is to be altered. Alternatively, the nitride semiconductor laser of the present example can be fabricated by periodically separating the p-electrode so that the length in the stripe direction (horizontal direction) is 700 µm, for example, and dividing the wafer at a point 600 µm to the left and 100 µm to the right, for example, of the separated point. Although the present example is disadvantageous as to the lasing threshold, it is expected that the reliability such as the laser lifetime can be improved by virtue of a larger injection region. In the nitride semiconductor laser thus fabricated, the ratio of the length of the saturable absorption region (L1) to the length of the injection region (L2), i.e. L1/L2, becomes 0.15. Therefore, with regards to the summation $\Gamma_{S.A.}$ of the confinement coefficient of the entire saturable absorber, $\Gamma_{S.A.}=L1/L2$ is established, satisfying the condition of $0.02 \leq \Gamma_{S.A.} \leq 0.30$. Modification, as necessary, is allowed such as setting the length of the saturable absorption region (L1) to 20 µm with respect to the length of the injection region (L2) set to 500 µm. The present Example 8 allows advantages in accordance with Examples 1 and 3.

EXAMPLE 9

Example 9 is directed to a structure in which reverse bias can be applied across second p-electrode 14 and n-electrode 1 in the semiconductor laser device of Example 1, in order to further reduce the carrier lifetime in the saturable absorption region.

Figure 15:
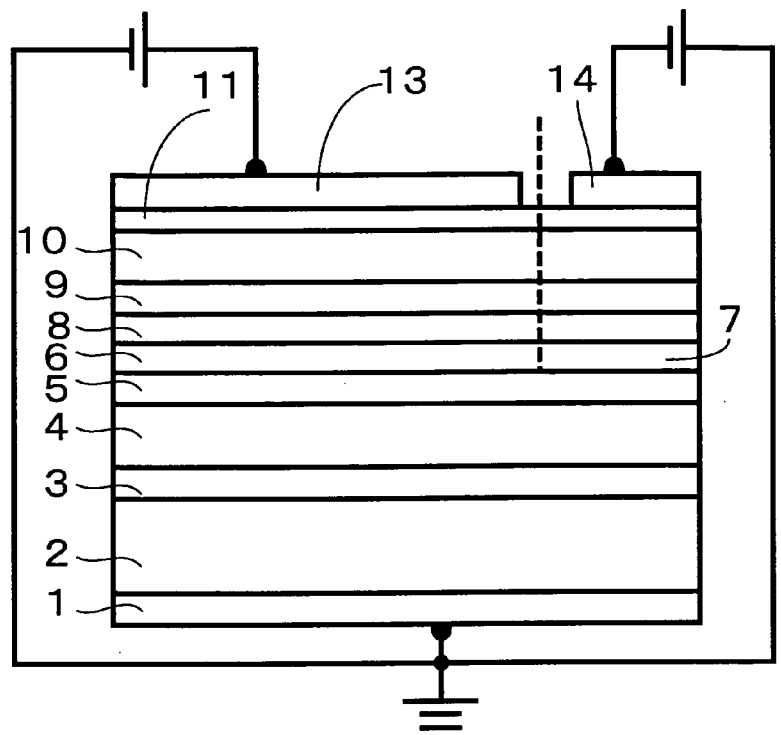
FIG. 15 is a vertical sectional view parallel with the cavity of a nitride semiconductor light emitting device of the present invention with connections.

FIG. 15 is a vertical sectional view parallel with the cavity of the semiconductor laser device of Example 9 with connection. From the substrate side are located an n-electrode 1, a GaN substrate 2, an n type GaN layer 3, an n type AlGaN clad layer 4, an n type GaN guide layer 5, an active layer 6 formed of a nitride semiconductor containing mainly In and Ga, a saturable absorber 7 formed of a nitride semiconductor containing mainly In and Ga, a p type AlGaN carrier block layer 8, a p type GaN guide layer 9, a p type AlGaN clad layer 10, a p type GaN contact layer 11, a first p-electrode 13, and a second p-electrode 14.

Connection is established such that forward bias is applied to the active layer (p-n junction) at first p-electrode 13 and reverse bias is applied to the active layer (p-n junction) at second p-electrode 14.

By such a structure, the carrier lifetime can be controlled from an external source in addition to controlling the carrier lifetime through the device structure. Although the structure set forth above is disadvantageous in rendering complex the application circuit in addition to the increase of the threshold value, the characteristics of the device can be adjusted more easily. Therefore, a self pulsation laser of a more stable level can be achieved.

EXAMPLE 10

Figure 16:
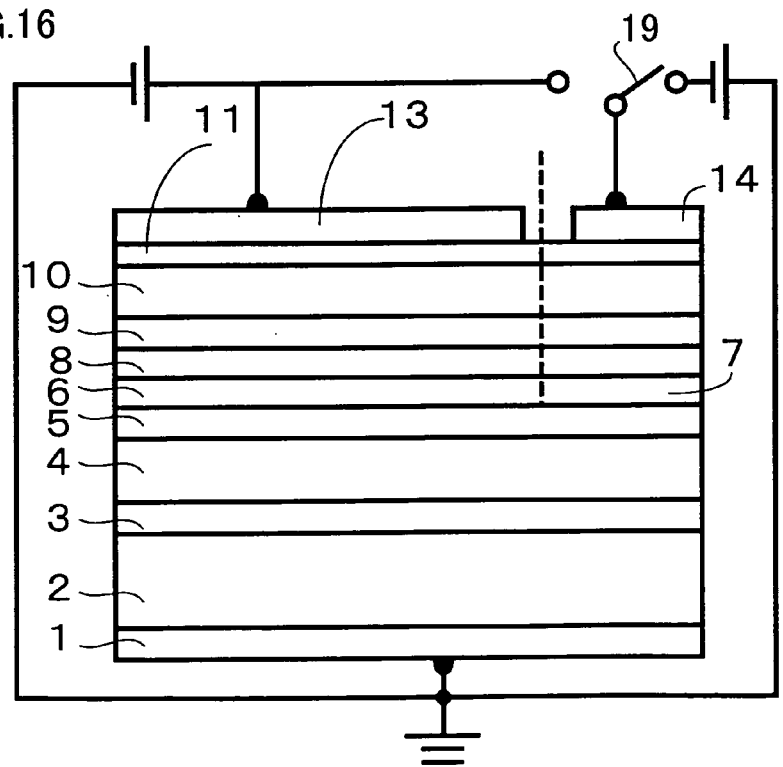
FIG. 16 is a vertical sectional view parallel with the cavity of a nitride semiconductor light emitting device of the present invention with switchable connections.

Example 10 is directed to a modification of the drive circuit of Example 9. When sufficient carriers are injected to the p-n junction by forward bias from first p-electrode 13, and the semiconductor laser provides high output oscillation, forward bias is also applied to the p-n junction of second p-electrode 14 to reduce absorption. FIG. 16 is a vertical sectional view parallel with the cavity of the semiconductor laser device of Example 10 with connection. From the substrate side are provided to an n-electrode 1, a GaN substrate 2, an n type GaN layer 3, an n type AlGaN clad layer 4, an n type GaN guide layer 5, an active layer 6 formed of a nitride semiconductor containing mainly In and Ga, a saturable absorber 7 formed of a nitride semiconductor containing mainly In and Ga, a p type AlGaN carrier block layer 8, a p type GaN guide layer 9, a p type AlGaN clad layer 10, a p type GaN contact layer 11, a first p-electrode 13 and a second p-electrode 14. Connection is established such that reverse bias and forward bias can be applied in a switched manner to the active layer at second p-electrode 14. Therefore, a switch 19 is formed in the neighborhood of second p-electrode 14. In the case where forward bias is applied to the p-n junction of second p-electrode 14 as in the present example, switch 19 is connected to the first p-electrode 13 side.

In a self pulsation laser, high power operation becomes difficult due to the presence of a saturable absorption region. This drawback can be alleviated in accordance with the structure of Example 10 since the saturable absorption region can be used as a light emitting region in a high power operation of laser. The present example is advantageous in that two types of laser, i.e. self pulsation laser in a low power mode, and high-output laser in a high power mode, can be achieved based on one structure by switching the connection as set forth above.

The nitride semiconductor light emitting device of the present invention provides stable light output and exhibits favorable self pulsation characteristics without thermal hysteresis during the growing process by a virtue of the above-described structure. The nitride semiconductor light emitting device of the present invention can exhibit further favorable self pulsation characteristics by having the p-electrode and n-electrode electrically short-circuited in at least one of the regions of the separated electrode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride semiconductor light emitting device comprising at least a substrate, an active layer formed of a nitride semiconductor containing mainly In and Ga, an optical cavity, two electrodes comprising a p-electrode and an n-electrode, wherein the p-electrode or the n-electrode is divided into at least two regions, and wherein all the regions of said p-electrode or n-electrode share the optical cavity.

2. The nitride semiconductor light emitting device according to claim 1, wherein said nitride semiconductor light emitting device has self pulsation characteristics.

3. The nitride semiconductor light emitting device according to claim 1, wherein said active layer has a bandgap of at least 2.6 eV, and said nitride semiconductor light emitting device has self pulsation characteristics.

4. The nitride semiconductor light emitting device according to claim 1, wherein said active layer has a bandgap of at least 2.6 eV, and said nitride semiconductor light emitting device has self pulsation characteristics in a light output range of at least 5 mW.

5. The nitride semiconductor light emitting device according to claim 1, wherein the p-electrode and n-electrode are electrically short-circuited in at least one of the regions of said separated electrode.

6. The nitride semiconductor light emitting device according to claim 1, wherein the p-electrode and n-electrode are electrically short-circuited in at least one of the regions of said separated electrode, and said nitride semiconductor light emitting device has self pulsation characteristics.

7. The nitride semiconductor light emitting device according to claim 1, wherein said active layer has a bandgap of at least 2.6 eV, and the p-electrode and n-electrode are electrically short-circuited in at least one of the regions of said separated electrode. and said nitride semiconductor light emitting device has self pulsation characteristics.

8. The nitride semiconductor light emitting device according to claim 1, wherein said active layer has a bandgap of at least 2.6 eV, and the p-electrode and n-electrode are electrically short-circuited in at least one of the regions of said separated electrode, and said nitride semiconductor light emitting device has self pulsation characteristics in a light output range of at least 5 mW.

9. The nitride semiconductor light emitting device according to claim 1, wherein one of said electrodes electrically separated into said at least two regions contacts a first mirror facet of two mirror facets forming said optical cavity, and said first minor facet has a reflection film containing a conductive material, and the p-electrode and n-electrode are electrically connected by said reflection film.

10. The nitride semiconductor light emitting device according to claim 9, wherein said first mirror facet is positioned at a side of said optical cavity opposite to an output side of said optical cavity.

11. The nitride semiconductor light emitting device according to claim 9, wherein said conductive material includes Al.

12. The nitride semiconductor light emitting device according to claim 1, wherein a resistor is provided between said p-electrode and said n-electrode in at least one of the regions or said electrode electrically separated into said at least two regions.

13. The nitride semiconductor light emitting device according to claim 12, wherein said device has self pulsation characteristics that are adjusted by said resistor provided between said p-electrode and said n-electrode.

14. The nitride semiconductor light emitting device according to claim 1, wherein Si is added as an n-type impurity into said active layer, and a concentration of said Si in said layer is $1 \times 10^{17}/cm^3$ to $5 \times 10^{18}/cm^3$.

15. The nitride semiconductor light emitting device according to claim 1 wherein Si is added as an n-type impurity, and an average concentration of said Si is $1 \times 10^{17}/cm^3$ to $5 \times 10^{18}/cm^3$ in a region from p-n junction to said active layer.

16. The nitride semiconductor light emitting device according to claim 1, wherein the p-electrode and n-electrode are electrically short-circuited in at least one of the regions of said separated electrode, and a range of $0.02 \leq L1/L2 \leq 0.30$ is established, where L1 is a total length of the region or regions of the separated electrode that are electrically short-circuited, and L2 is a total length of the region or regions of the separated electrode that are not short-circuited.

17. The nitride semiconductor light emitting device according to claim 1, wherein connection is established such that at least one of said electrodes separated into at least two regions has reverse bias applied to said active layer and another of said electrodes separated into at least two regions has forward bias applied to the active layer.

18. The nitride semiconductor light emitting device according to claim 17, wherein connection is established such that at least one of said electrodes separated into at least two regions has reverse bias and forward bias applied in a switched manner to said active layer.

* * * * *